United States Patent [19]
Kato

[11] Patent Number: 5,978,069
[45] Date of Patent: Nov. 2, 1999

[54] EXPOSURE APPARATUS AND METHODS

[75] Inventor: Masaki Kato, Yokohama, Japan

[73] Assignee: Nikon Corporation, Tokyo, Japan

[21] Appl. No.: 09/009,365

[22] Filed: Jan. 20, 1998

[30] Foreign Application Priority Data

Jan. 17, 1997 [JP] Japan .................................. 9-017647
Jan. 17, 1997 [JP] Japan .................................. 9-017648

[51] Int. Cl.$^6$ ........................... G01B 11/00; G03B 27/42
[52] U.S. Cl. ........................... 355/53; 356/400; 356/401
[58] Field of Search .............................. 355/53; 356/399, 356/400, 401; 250/248, 559.3

[56] References Cited

U.S. PATENT DOCUMENTS

| 4,814,830 | 3/1989 | Isohata et al. . |
| 4,943,733 | 7/1990 | Mori et al. . |
| 5,486,896 | 1/1996 | Hazama et al. . |
| 5,734,478 | 3/1998 | Magome et al. ........................ 356/401 |
| 5,844,247 | 12/1998 | Nishi ...................................... 356/401 |

FOREIGN PATENT DOCUMENTS 60-271455  7/1986  Japan .

Primary Examiner—Alan A. Mathews
Attorney, Agent, or Firm—Klarquist Sparkman Campbell Leigh & Whinston, LLP

[57] ABSTRACT

Exposure apparatus are disclosed that are particularly adapted for exposing relatively large patterns on a photosensitive substrate. The apparatus include an optical illumination system for illuminating a reticle supported by a reticle stage, an optical projection system for projecting an image of a pattern on the reticle to a photosensitive substrate supported on a plate stage, a reference mark on the plate stage, a fixed mark between the position at which the reticle is loaded and the optical projection system, and three position detecting systems. A first position detecting system detects the position of a substrate on the plate stage and/or the position of the reference mark; a second position detecting system detects the relative position of the reference mark and a reticle on the reticle stage; and the third position detecting system detects the relative position of the reference mark and the fixed mark. Applying the third system, the reference mark is used, together with a plate stage interferometer system, to check the relative position of the fixed mark, using an optical path through the optical projection system. Any deviation in the measured position of the fixed mark is corrected, as drift of the reference mark. The correction is then applied to the use of at least one of the first and second systems.

21 Claims, 18 Drawing Sheets

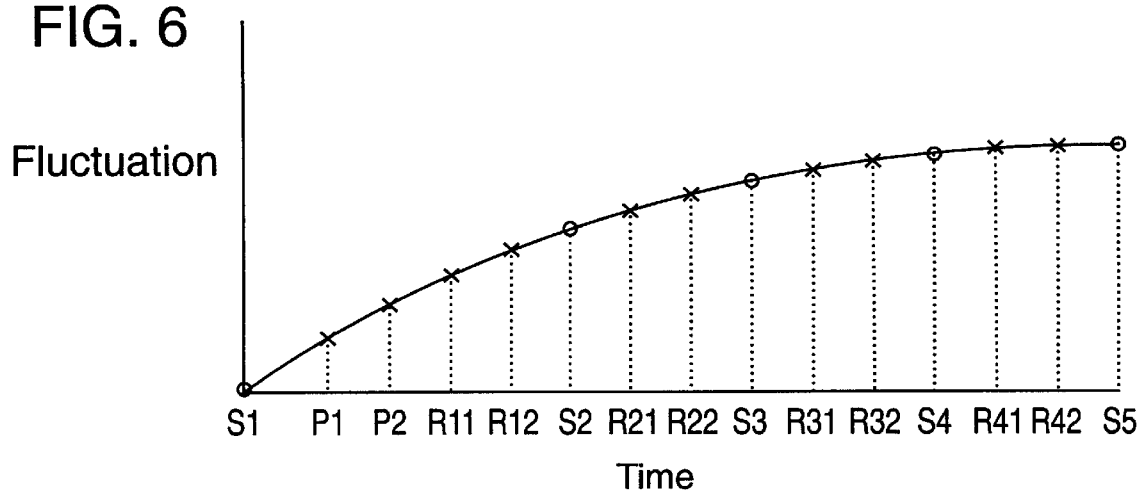
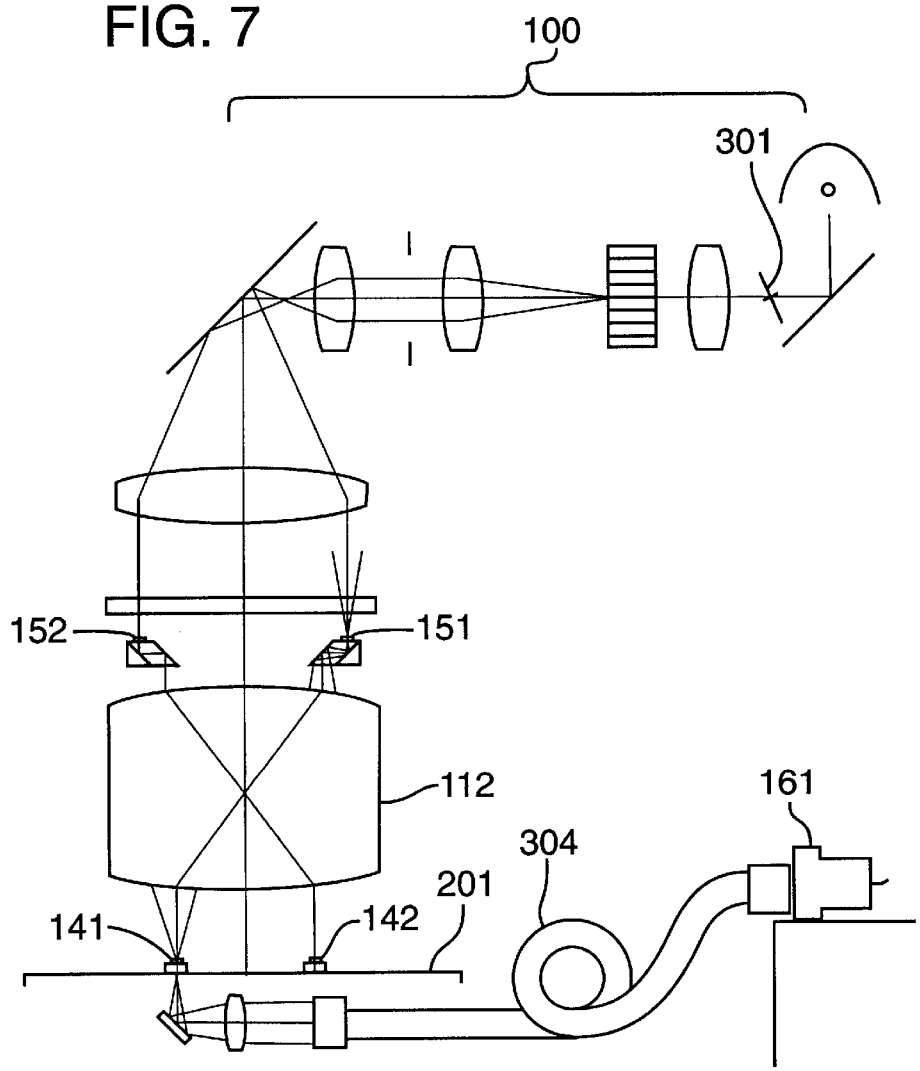

(i)    (ii)    (iii)

Signal Level

Measurement Point

Substrate Stage (Reference Mark) Position

EXPOSURE APPARATUS AND METHODS

FIELD OF THE INVENTION

The present invention relates to exposure apparatus that produce display devices, such as liquid crystal displays, plasma display panels (PDPs), or other flat-panel displays, or semiconductor devices, utilizing an optical lithographic process, particularly to such exposure apparatus that employ more than one reticle to form a single pattern layer, and to methods for using such exposure apparatus.

BACKGROUND OF THE INVENTION

Reference positions within an exposure apparatus for producing relatively large patterns, such as are required to produce a large-scale liquid crystal display panel, may be determined by means of one or more reference marks arranged on a plate stage. Using such a reference mark on the plate stage, a reticle positioning mark (or marks) on a reticle are compared to the reference mark through an optical projection system, and the position of the reticle, as projected through the optical projection system, is thus measured relative to a plate-stage coordinate system.

In an exposure apparatus for exposing patterns, such as for a liquid crystal panel, in which a single large image must be formed using a plurality of reticles, each of the plurality of reticles is loaded successively onto a reticle stage, positioned by a reticle alignment system, and measured relative to a plate-stage coordinate system. In this way, a baseline is obtained for each reticle before any exposure is made.

Conventional methods to detect the position of each reticle include a method as described in Japanese Patent Publication No. 61-143760. According to this method, the relative position between the reticle and the plate stage is detected by the use of reticle positioning marks on the reticle and reference marks on the plate stage, with a light-receiving sensor disposed under the reference marks. Another conventional method is described in Japanese Patent Publication No. 63-284814 and U.S. Pat. No. 4,943,73, wherein a slit on the reference mark on the plate stage receives light from the plate stage side, and the relative position of a slit-type reticle positioning mark is detected through an optical projection system by a light-receiving sensor located inside an illuminating optical system.

The reference marks on the plate stage are conventionally placed at the side of the top surface of the stage, on a raised platform or rim next to the location at which a substrate is to be supported, such that the marks are approximately at the height of the image plane. In an exposure apparatus for use with an especially large, generally square-shaped substrate, such conventional reference marks have the disadvantages of increasing the width and weight of the stage, and of requiring a large range of stage movement to bring the marks to various measurement locations.

An exposure apparatus of the type for exposing large substrates also typically includes a plate alignment system for aligning a plate. (A plate is a substrate, e.g., glass, on which a display is to be formed, typically having been prepared with a photosensitive coating thereon). When a device layer is to be exposed on a plate, the plate alignment system detects the position of the plate, or the position on the plate of a previously exposed device layer. In preparation for such use of the plate alignment system, the one or more reference marks are used to measure the position of the plate alignment system. The baseline of the plate alignment system in an exposure apparatus is obtained in this way.

Normally, before an exposure is made, after executing the above baseline measurement processes for the plate alignment system, and for the reticles to be used, the plate alignment system monitors plate alignment marks on a plate that is transported onto the plate stage, and thereby measures the plate position. The exposure apparatus then properly positions the plate, using the plate alignment system, and the reticle(s), using the reticle alignment system, according to the measured baseline values, and then performs an exposure.

Also during exposure, twisting (yawing) of the plate stage, which can occur when the stage steps from one substrate exposure location to another, may be corrected. The twisting is measured by the interferometer system of the plate stage. The reticle is rotated appropriately to compensate for the measured twisting by determining an offset of a reticle alignment mark relative to an index mark inside the reticle alignment system, and rotating the reticle to this offset position by, for example, a motor or a push-pull spring.

According to the above-described technology, when using a plurality of reticles, time is required to exchange the reticle and to detect the position of the plate alignment system and reticle. Additional time is required to inspect for foreign matter on the reticle. Although a total of four reticles has been used for one pattern layer, because of device optimization and larger panel sizes in recent years, it is becoming necessary to provide six or more reticles for a single pattern layer. In an apparatus utilizing a reference mark to detect the relative position of a reticle loaded on a reticle stage and the position of a plate alignment system, use of additional reticles increases the time required to measure the relative position of each reticle and the position of the plate alignment system. During this time, forces due to movement of the stage and thermal variations result in drifting of the position of the reference mark itself. This leads to a problem wherein the measured values change increasingly with passage of time.

Certain problems have also existed in standard reticle alignment systems. Because a standard reticle alignment system itself is formed on quite a large base and the relative positions of the index mark and the reticle alignment mark are measured through an optical system, relative deformation of the base of the reticle alignment system may be caused by temperature variations over time. Changes to the optical system of the reticle alignment system may also occur over time, as well as fluctuations due a relatively long space between the index mark located inside the reticle alignment system and the reticle alignment mark of the reticle. Vibrations of the apparatus can also cause fluctuations and drift in the reticle alignment system.

OBJECTS AND SUMMARY OF THE INVENTION

An object of the present invention is to provide exposure apparatus that can eliminate or reduce the influence, on the positioning of the substrate or reticle, of relative drifting of reference marks inside the apparatus that occurs over time. Another object is to provide exposure apparatus that can make necessary baseline measurements quickly. An additional object is to provide methods to produce a display device such as a liquid crystal element using the above-mentioned exposure apparatus. Furthermore, another object of the present invention is to provide exposure apparatus that can reduce effects of changes of the reference marks on the plurality of reticles, i.e., eliminate or reduce the effects of drift of reticle reference marks, as well as provide methods to produce a display device such as a liquid crystal element using the thus improved exposure apparatus.

In order to achieve the above-mentioned objects, a preferred embodiment of a projection exposure apparatus of the present invention comprises an exposure illumination system that uses exposure light to illuminate a reticle on which is formed a pattern to be exposed, and an optical projection system that forms an image of the pattern onto a photosensitive substrate. A plate stage moves along the image plane of the optical projection system and receives and supports the plate or other photosensitive substrate. The plate stage includes a reference mark disposed on the plate stage. A fixed mark is located between the position where the reticle is loaded and the optical projection system. A first position detection system is used for detecting the position of the photosensitive substrate and for detecting the position of the reference mark (relative to the first position detecting system itself). A second position detection system is used for detecting the relative position of the reference mark and the reticle. A third position detection system is used for detecting the relative position of the reference mark and the fixed mark. Based on information related to the relative position between the reference mark and the fixed mark obtained by the third position detection system, a correction system corrects at least one from among the following: (1) the detected relative position of the reference mark and the first position detection system, as obtained by the first position detection system; (2) the detected position of the substrate, as obtained by the first position detection system; and (3) the detected relative position of the reference mark and the reticle, as obtained by the second position detection system. In an exposure apparatus according to the present invention, measurement errors due to effective drifting of the reference mark may thus be corrected.

According to another embodiment of the present invention, a parallel flat plate is positioned within the exposure optical path between either the position where the reticle is loaded and the optical projection system, or between the optical projection system and the plate stage. An optical member acting as a beamsplitter and/or combiner is located outside the exposure optical path between the position where the reticle is loaded and the optical projection system. A second position detection system employs a first optical path to optically detect the relative position of the reference mark and a plurality of reticles. A third position detection system employs a second optical path to optically detect the relative position of the reference mark and the fixed mark. Both the first and second optical paths pass through the optical projection system and the optical member.

In this embodiment, a compound optical system formed by a combination of the optical member and the optical projection system makes the reticle positioning mark and the reference mark optically conjugate along the first optical path, and the fixed mark and the reference mark optically conjugate along the second optical path. The compound optical system formed by the parallel flat plate and the optical projection system makes a pattern region of a reticle and the surface of a plate optically conjugate.

An exposure apparatus of the present invention can include an reticle exchange apparatus that successively places a plurality of reticles at the object surface of the optical projection system. Each time one of the plurality of reticles is successively placed by the reticle exchange apparatus, the signal correction system computes a correction amount based on the relative position of the reference mark and the fixed mark obtained by the third position detection system. Based on the correction amount, at least one of the following are corrected for each reticle during the baseline measurement process: (1) the relative position information obtained by the second position detection system; and (2) the relative position information obtained by the first position detection system.

Because of the above-mentioned corrections, measurement errors caused by drifting of the reference marks are corrected to a high degree. Namely, by using the fixed marks for each reticle to carry out the calibration or baseline measurement, the effective time in which drift may occur calibrating for the plurality of reticles is only the very short period between the measurement of the fixed mark and the reference mark of one reticle and the final measurement measured for that reticle. (Before the next reticle is measured, another measurement of the fixed marks is performed.) Any drift occurring during this short period can be interpolated, using the various drift amounts measured for the positions of the fixed marks. Even more minute amounts of drift can thus be estimated and corrected.

During measurement of relative positions using the reference mark(s), each reference mark is preferably disposed at a height essentially identical to the height of the photosensitive surface of a plate supported on the plate stage. The measurements are performed with light of an exposure wavelength, such that the measurements are made under conditions essentially identical to actual exposure of a reticle pattern onto a plate.

The reference mark(s) on the substrate stage preferably are retractable, so as to withdraw from the image plane of the optical projection system into the plate stage. Because such reference marks can be disposed at the position of the plate stage where the substrate should be loaded, it is possible to avoid increases in the size of the stage that would otherwise be required to incorporate the reference marks, as well as accompanying increases in the size of the overall apparatus.

The apparatus can also include a magnification system for forming an image, of the marks to be measured, on a photoelectric detector. This can provide increased mark detection accuracy. An image-sensing element can be used as the photoelectric detector. Alternatively, a photoelectric detector that senses intensity only, and not images, can be used.

The exposure apparatus of the present invention can be arranged to allow the second position detection system and the third position detection system to operate sequentially, at almost the same time, so that the time required for the detection can be shortened.

The apparatus of the present invention can also include a reference mark illumination system used in the third and second position detection systems to illuminate, with light of exposure wavelength traveling in the direction from the plate stage toward the optical projection system, the reference marks. The reference mark illumination system can also be used to illuminate, through the optical projection system, the marks (i.e., the reticle positioning mark(s) or the fixed marks) to which the reference marks are compared. The apparatus can alternatively include a fixed mark illumination system used to illuminate, in the third position detection system, the fixed mark(s). The fixed mark illumination system can also be used to illuminate, through the optical projection system, the reference mark(s), while the main optical illumination system is used for illumination in the second position detection system. These embodiments allow the size of the illumination field provided by the main optical illumination system to be minimized, for increased brightness during exposure and resulting increased throughput.

Alternatively, the main optical illumination system may be used directly to provide illumination for all measurements. In this case, or in case a fixed mark illumination system is provided, a photoelectric detector used in both the third and second position detection systems is arranged to receive light passing through the reference mark(s) from the optical projection system. A light guide can be used to isolate the photoelectric detector and any heat produced thereby from the plate stage.

If a reference mark illumination system is provided, a photoelectric detector for use in the third and second detection systems is arranged to receive light passing through a portion of the optical illumination system from the optical projection system. This detector may be used only in the second position detection system, if each fixed mark has an individual photoelectric detector. (This allows use of less sensitive photoelectric detectors for the fixed marks.)

Because at least one fixed mark is used, it is possible to correct for effective drift of the reference mark(s) so as to produce high quality display devices at a high throughput. Also, because the relative positions of the various marks are measured optically by an optical path including the optical projection system, drift due to changes in the optical projection system itself is compensated.

The foregoing and other objects, features, and advantages of the invention will become more apparent from the following detailed description of preferred embodiments which proceeds with reference to the accompanying drawings.

BRIEF DESCRIPTION OF THE DRAWINGS

FIG. 6 is a graph showing drift amount corresponding to baseline measurements for each of a plurality of reticles that may be used in the exposure apparatus of FIG. 1.

FIG. 7 is a schematic elevational diagram showing an alternate embodiment having certain similarities to the FIG. 1 embodiment.

DETAILED DESCRIPTION

Figure 1:
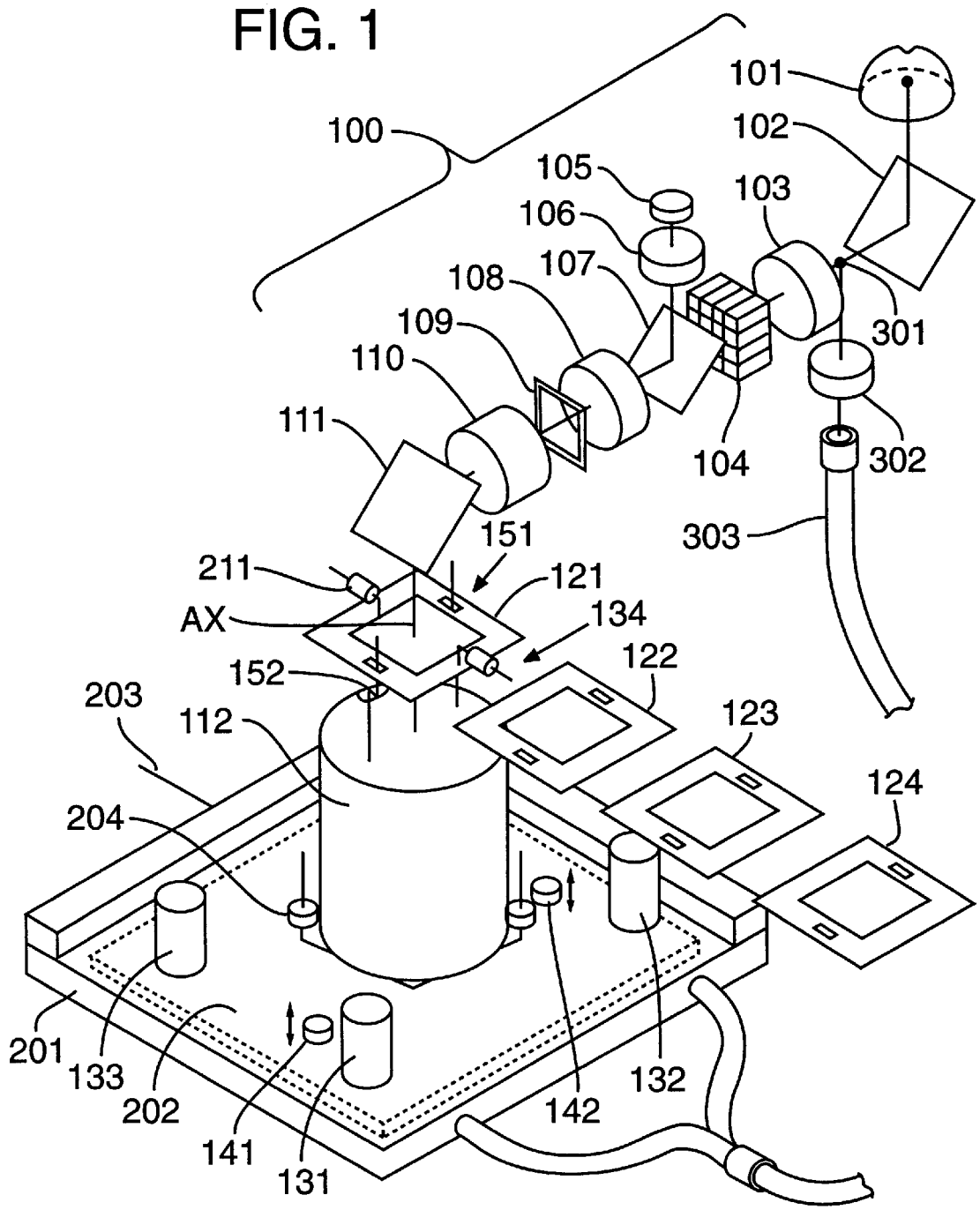
FIG. 1 is a perspective view that schematically shows certain elements of a first representative embodiment of an exposure apparatus according to the present invention.

In the following, several example embodiments of an exposure apparatus and the operation thereof according to the present invention are described. Redundant descriptions of components having identical reference numerals or members corresponding in form or function to each other in the various embodiments are omitted.

FIG. 1 shows a perspective schematic view of a first representative embodiment of an exposure apparatus according to the present invention. This embodiment includes an optical illumination system 100 comprising (in order along an optical path): a light source 101 such as a super high pressure mercury lamp, a reflecting mirror 102, a collimator lens 103, an optical integrator 104, a half mirror 107, a relay lens 108, a reticle blind 109, a reticle blind image forming optical system 110, and a reflecting mirror 111. In this same direction along the optical path, the apparatus further includes, after the illumination system 100, an optical projection system 112, and a plate stage 201.

A shutter 301 is disposed between the reflecting mirror 102 and the collimator lens 103. As necessary, light from the light source 101 can be directed to the outside of the optical illumination system 100 by a reflective surface near or on the shutter 301. The light directed outside of the optical illumination system is converged at the incoming side of an optical fiber 303 by a convergence lens 302.

The half mirror 107 is arranged such that it guides the a small percentage of the light inside the optical illumination system 100, traveling back toward the light source 101, to the outside of the optical illumination system to pass through a lens 106 and form an image on the light receiving surface of a light receiving element 105 such as a photoelectric conversion element (photoelectric detector). The light receiving surface of the light receiving element 105 is positioned so as to be optically conjugate to the surface of a plate 202.

Between the reflecting mirror 111 and the optical projection system 112 is disposed a reticle stage (not shown) that can successively receive reticles 121, 122, 123, and 124 whereon are formed patterns to be exposed. A conventional reticle alignment system 211 is provided to align the reticles as desired on the reticle stage.

Fixed marks 151, 152 (in FIG. 1, fixed mark 151 is hidden by the reticle 121) are securely disposed against the reticle stage between the position where the reticle should be loaded and the optical projection system 112. In concrete terms, the fixed marks are secured to, for example, a base that supports the reticle stage, which stage is movable in the x, y, and θ directions (the x and y directions being mutually orthogonal directions within a plane perpendicular to the optical axis, and θ being a rotation around an axis perpendicular to the optical axis AX [typically around the optical axis AX]). The movement of the reticle stage is thus independent of the fixed marks 151, 152.

Around the optical projection system 112, four plate alignment systems 131–134 (only three, 131, 132, and 133, are shown in FIG. 1) are arranged slightly inside the four corners of a plate 202 on the plate stage 201 when the plate stage 201 is centered directly under the optical projection system 112. These plate alignment systems 131–134 constitute part of a first position detection system used in the present invention.

A plate interferometer 203 measures the position of the plate stage 201 using a plate stage coordinate system.

Reference marks 141, 142 are disposed on the plate stage 201. The plate stage 201 provides a level surface for loading a substrate. The two reference marks 141, 142 are arranged to protrude from the surface of the stage whenever a substrate is not loaded, and to withdraw inside the stage before a substrate is loaded, to prevent the reference marks from interfering with the substrate loading. The distance between the two reference marks 141, 142 is preferably almost identical to the distance between the plate alignment systems 131 and 132. If a plurality of reference marks is provided and if the distance between the reference marks is appropriately set, the distance the plate stage 201 travels can be shortened when measuring the position of the plate alignment systems 131–134 using the reference marks 141, 142 and the plate interferometer 203, and the throughput of the apparatus thereby improved.

An auto-focus system 204 for the optical projection system 112 is disposed between the optical projection system 112 and the plate stage 201.

When projecting and exposing the patterns on the reticles 121, 122, 123, 124 onto a plate 202 (having a photosensitive material thereon) loaded on the plate stage 201, the light of the light source 101 is selected by an interference filter (not shown in the figure) in an exposure wavelength (for example, g-line, h-line, or i-line). The reticle 121 is loaded on the reticle stage (not shown) and illuminated through the optical illumination system 100. The pattern on the reticle is transferred by the illumination onto the plate 202 (indicated by the dotted lines) loaded on the plate stage 201 through the optical projection system 112. By exposing multiple cooperating reticles onto the plate 202 (for example, the four reticles 121, 122, 123, 124), a pattern for forming a large liquid crystal panel may be produced on the plate 202.

To measure the baseline in this exposure apparatus, the plate stage 201 is not loaded with a plate, and the reference marks 141, 142 are raised. The surfaces of the reference marks 141, 142 are raised such that they approximately meet the image plane of the optical projection system 112. Because there are preferably a plurality of reference marks 141, 142 (two in this embodiment) and they move upward and downward, it is possible to minimize the size of the stage 201 as previously described.

In operation of the present invention, three position detection systems are employed. The first position detection system detects the position of a plate, and the position of the position detection system itself relative to the reference marks 141, 142. The first position detection system includes the plate alignment systems 131, 132, 133, 134 and cooperating elements, such as the plate 202, the plate stage 201 and plate stage interferometer 203, and the reference marks 141, 142.

The second position detection system detects the relative position of a reticle and the reference mark 141 (or marks 141, 142) by using the plate stage interferometer 203 to determine the relative position, in the plate stage coordinate system, of marks on the reticle. This second position detection system includes the marks being measured, the plate stage 201 and the plate stage interferometer 203, and various other elements, depending upon the particular embodiment of the invention as described below.

The third position detection system detects the relative position of the reference mark(s) and the fixed mark(s) 151, 152. This third position detection system similarly includes the marks being measured, the plate stage 201 and the plate stage interferometer 203, and various other elements, depending upon the particular embodiment of the invention as described below.

The third position measurement system is preferably used to measure the positions of the fixed marks 151, 152 using the reference marks 141, 142 as follows: Light reflected by the shutter 301 so as to travel outside of the optical illumination system 100 is guided to the reference marks 141, 142 on the plate stage 201 by the optical fiber 303 to provide illumination light for the measurement. The illumination light is selected in an exposure wavelength by an interference filter (not shown). Images of the reference marks 141, 142 illuminated by the illumination light are formed, respectively, by the optical projection system 112, on the prism-shaped fixed marks 151, 152, arranged approximately at the object plane of the optical projection system 112. (The illumination light for the measurement thus propagates through the optical projection system 112 in an opposite direction to the direction of light used to expose a reticle pattern onto a photosensitive substrate.)

Figure 3A:
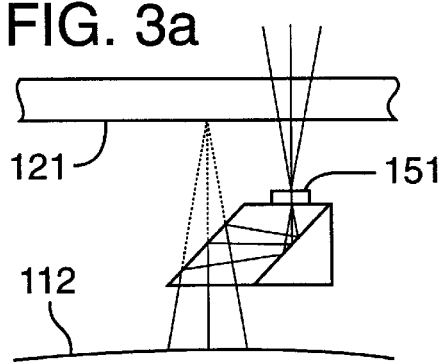
FIGS. 3(a)–3(b) show two examples of a fixed mark that may be used with the exposure apparatus of FIG. 1.
Figure 3B:
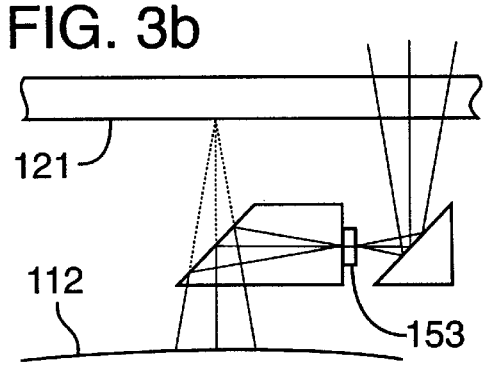

The fixed marks may be constituted as shown by the examples shown in FIGS. 3(a)–3(b). In the fixed mark shown in FIG. 3(a), light arriving in a direction parallel to the optical axis through the optical projection system 112 from the plate stage is completely reflected once to travel laterally. The light is then completely reflected and directed parallel to the optical axis toward the reticle. The marks 151, 152 are formed on the emission surface of the prism. The marks 151, 152 are arranged to be approximately conjugate to the reference marks 141, 142 when light of an exposure wavelength is used. Therefore, when exposure light is used, the image of the reference marks 141, 142 is formed on the fixed marks 151, 152 through the optical projection system 112. An alternate configuration of a fixed mark 153 is shown in FIG. 3(b)

Figure 4:
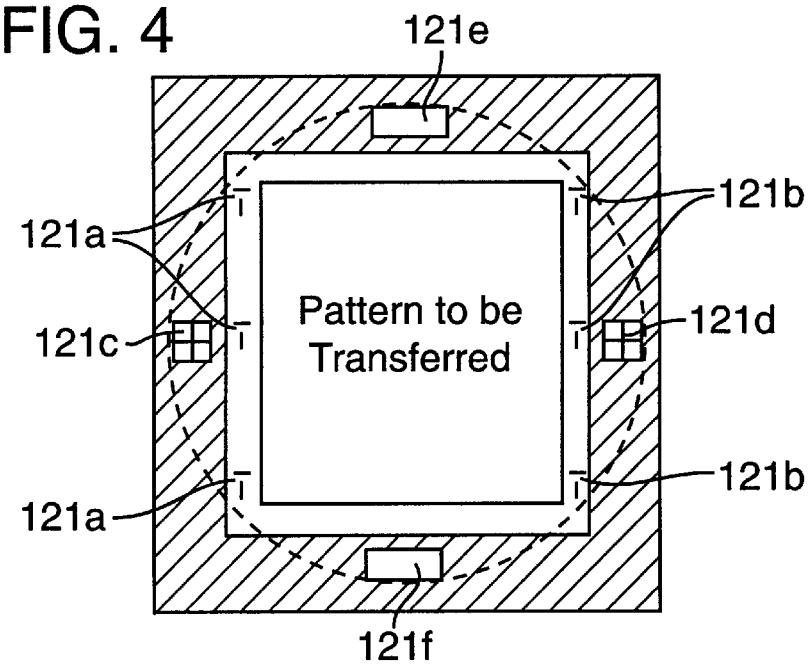
FIG. 4 shows an example reticle that may be used with the exposure apparatus of FIG. 1.

After passing through the fixed mark 151, the light passes through openings 121e, 121f, formed on the periphery of the reticle 121 to avoid the pattern area of the reticle 121, as shown in FIG. 4. (The reticles 122–124 have corresponding openings.) The light then travels through a portion of the optical illumination system 100 and is reflected by half-mirror 107 and intercepted by a light receiving element 105 such as a photoelectric conversion element (see FIG. 2).

Figure 5A:
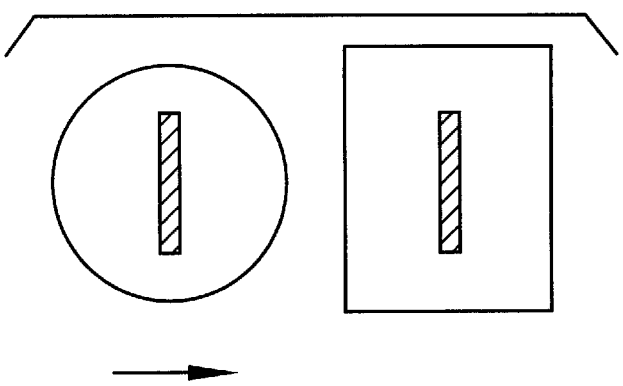
FIG. 5(a) shows an example of a pattern of the reference mark and a pattern of the fixed mark used by the exposure apparatus of FIG. 1.
Figure 5B:
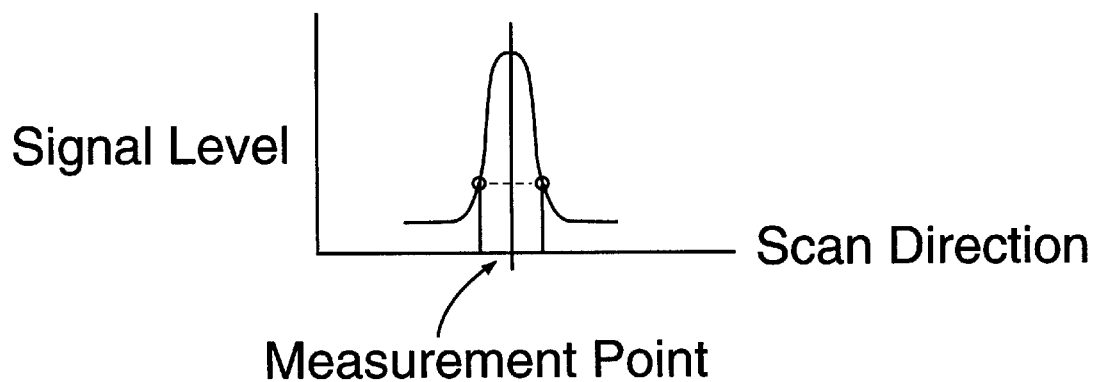
FIG. 5(b) shows an example of a signal detected by a light receiving element when each mark shown in FIG. 5(a) is scanned during operation of the exposure apparatus of FIG. 1.

The pattern of the reference mark 141 and the pattern of the fixed mark 151 are preferably slit marks such as shown in FIG. 5(a). The reference mark is indicated by the slit in the circular field of view, and the fixed mark is indicated by the slit in the square field of view. The fixed mark slit has a shape identical to the reference mark slit. As the plate stage 201 is scanned in a direction perpendicular to the slits (arrow), the signal detected by the light receiving element 105 when both slits are overlapped and then separated again becomes a peak-shaped signal with left and right symmetry, such as shown in FIG. 5(b). By detecting the midpoint of a horizontal slice cut at less than the full height of the peak-shaped signal, the position coordinates of the stage can be measured by the plate-stage interferometer 203. Thus, measurements of the fixed marks 152, 151 are made using the reference marks 141, 142.

Two fixed marks 152, 151 are preferably utilized because the position of the optical axis of the optical projection system 112 is considered to be a fixed point by arranging the two fixed marks symmetrically about the optical axis of the optical projection system 112. If desired, however, only one fixed mark may be used.

Figure 2:
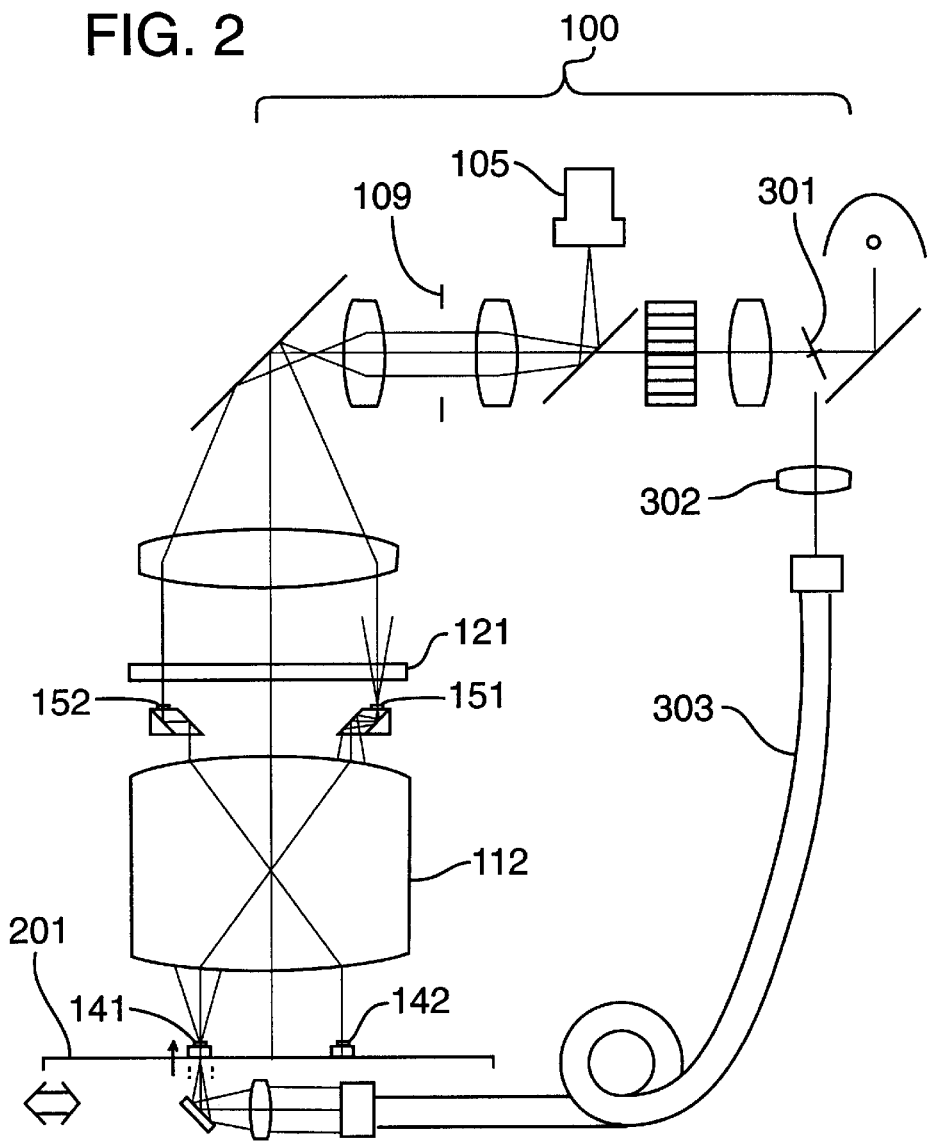
FIG. 2 is a schematic elevational diagram showing certain details of the FIG. 1 embodiment.
Figure 13:
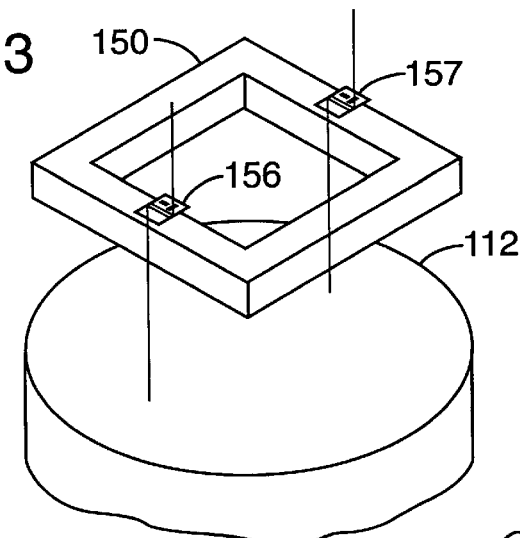
FIG. 13 shows an example of fixed marks, used by an exposure apparatus according to the present invention, formed on a single integrated annular frame.

In the embodiment shown in FIGS. 1 and 2, although the fixed marks 152, 151 are comprised as two independent members, two fixed marks 156, 157 can be arranged on a single annular member 150, as shown, for example, in FIG. 13, such that the distance between the two fixed marks 156, 157, is potentially less subject to change.

The first position measurement system is preferably used to check its own relative position for later reference. Using one reference mark 141, the positions of the plate alignment systems 131, 132 are measured. Using the other reference mark 142, the positions of the plate alignment systems 133, 134 are measured. (In FIG. 1, the plate alignment system 134 is hidden by the optical projection system 112.) By measuring at least one of the plate alignment systems using both reference marks 141, 142 the relative position of the reference marks 141, 142 with respect to each other may also be checked, if desired. These measurements make it possible to measure the position of the plate alignment systems, for example, by image processing and ordinary signal processing such as diffraction light detection utilizing laser light, if marks of the type for carrying out plate alignment are provided at the reference marks 141.

The second position measurement system is preferably used as follows. The reticle 121 is loaded onto the reticle stage, and positioning of the reticle 121 is performed using a reticle alignment system 211 employing reticle alignment marks 121c, 121d on the reticle 121, as shown in FIG. 4. (An alternate reticle alignment system 212 is shown in greater detail in FIG. 25). Although the references of the reticle alignment systems 211, 212, are not shown in the figures, an index plate, for example, having one or more index marks, and disposed inside the reticle alignment system, can be used as the reference. After the reticle is positioned by the reticle alignment system, the positions of the reticle positioning marks 121a, 121b are detected at multiple points, using the reference mark 141 and the light receiving element 105, as used for the fixed mark 151 and the reference mark 141, as described above.

The reticle positioning marks 121a, 121b in this embodiment are marks located close to the actual pattern to be transferred. They are so located in order that reticle writing errors in the pattern to be transferred will be represented in the positions of the reticle positioning marks 121a, 121b, (which are written together with the pattern to be transferred) such that writing errors may be measured and compensated.

By detecting the plurality of reticle positioning marks, using the reference mark 141, the positions of the reticle positioning marks are measured in the stage coordinate system through the optical projection system with the reticle alignment system as a reference. From the above steps, a baseline is obtained using the reticle 121.

Then, the reticle 121 is replaced with the reticle 122 and the reticle 122 is aligned using the reticle alignment system with the position fixed by the reticle alignment system used as a reference. The reference mark 141 is then used to detect the positions of the fixed mark 151 and the fixed mark 152. Any change in the positions of the fixed marks 151, 152 measured previously is measured as a drift amount of the reference mark 141. It is acceptable if an offset is added to the position of the mark such that the difference is set to zero, although interpolation may also be used, as described below in relation to FIG. 6.

A plurality of reticle positioning marks of the reticle 122 are then measured using the reference mark 141. Any shift in position of the reticle 122 relative to the reticle 121 is detected. By adding and controlling this shift to the reticle alignment system as an offset during the exposure process, the patterns of the reticle 121 and the reticle 122 can be arranged to have an identical relationship.

In like manner, the reticle 122 is then replaced with the reticle 123, and corresponding measurements are made, followed by the reticle 124. For each reticle, first the fixed marks are compared to the reference mark(s) so that any drift of the reference mark(s) may be compensated.

FIG. 6 shows a graph displaying a typical drift amount obtained corresponding to each reticle. The horizontal axis represents time. S1 to S5 correspond to times at which the fixed mark(s) are evaluated relative to the reference mark(s). R11 to R42 correspond to the times when the reticle positioning marks are measured, two for each of four reticles. P1 and P2 correspond to the times when the plate alignment systems are measured. (P3 and P4, times for measurement of the other plate alignment systems, are suitably located during the measurement of the fixed marks, although they are not shown in the figure.)

In operation of the apparatus of the present invention, drift is determined by measurement at the points S1 through S5, but the type of drift graphed in FIG. 6 makes it possible to find the drift amount at each measurement point (not just the fixed mark measurement points) utilizing interpolation or a similar process. If direct approximation or secondary approximation or other suitable interpolation method is used for the drift, even though drift occurs in the reference marks 141, it is possible to keep the effects of the drift minimal. If the measurement interval of the fixed marks 151, 152 is made even shorter, it is possible to find an even more accurate drift offset amount.

The signal correction system is a control system (not shown) that receives a position signal from the photoelectric conversion element 105 of FIG. 2 and an output signal from the plate interferometer 203 of FIG. 1 and performs corrections on the signals by interpolation as illustrated, e.g., in the graph of FIG. 6.

Figure 8:
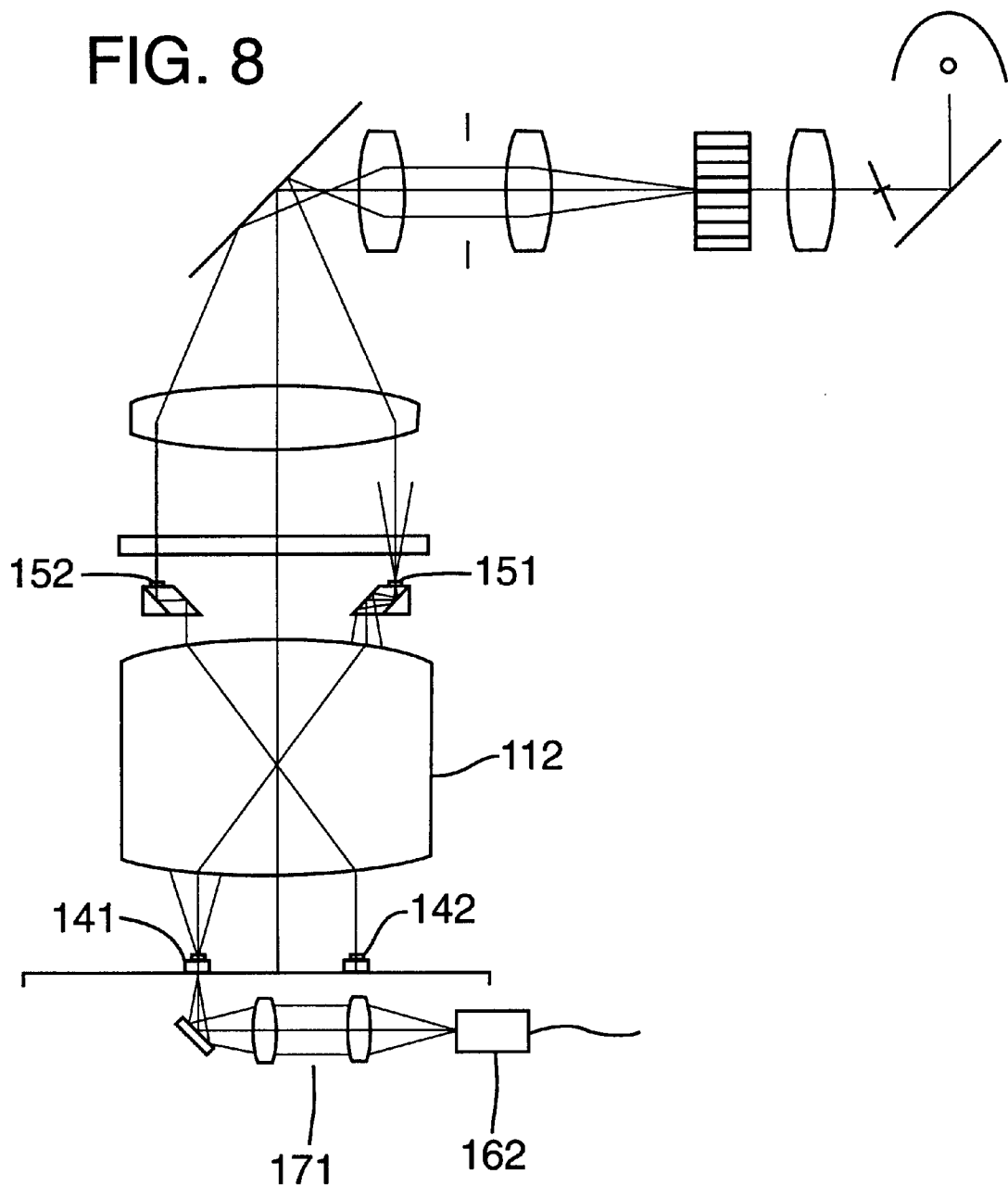
FIG. 8 is a schematic elevational diagram of a modification of the FIG. 7 embodiment.

FIG. 7 and FIG. 8 show alternate embodiments to the FIG. 1 embodiment. The embodiments of FIGS. 7 and 8 use light directly from the optical illumination system 100 to provide illumination to detect the fixed marks 151, 152 together with the reference marks 141, as well as the reticle positioning marks 121a, 121b (FIG. 4) together with the reference marks 141.

As shown in FIG. 7, the fixed marks 152, 151 are illuminated by the main illumination light of the optical illumination system 100. Light passing through the reference marks 141 (the light being provided by an optical image of the fixed marks 152, 151 formed on the fixed marks 141 by the optical projection system 112) is guided to a photoelectric conversion element 161 by an optical fiber 304. The photoelectric conversion element 161 can be disposed inside the plate stage 201, if desired. In order to reduce thermal expansion caused by heat generated by the photoelectric conversion element 161, the element 161 is preferably located where thermal effects are not significant, and the light is guided to the element 161 by the optical fiber 304. A slit opening or some other pattern can be used at the light reception surface of reference marks 141.

Figure 9A:
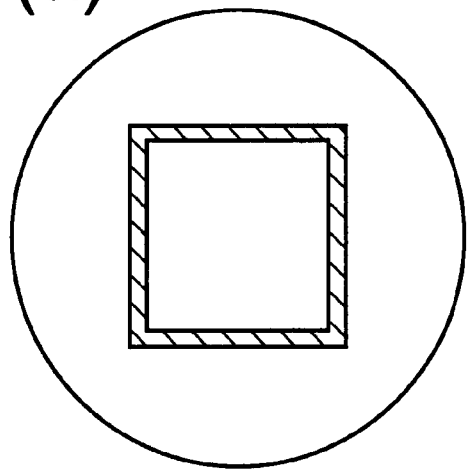
FIG. 9(a) shows an example of a pattern of the reference mark used by an embodiment of an exposure apparatus according to the present invention.
Figure 9B:
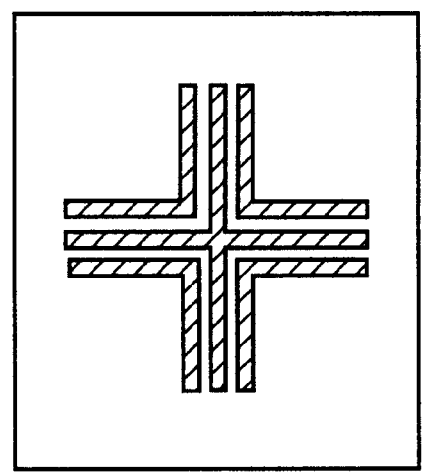
FIG. 9(b) shows an example of a pattern of the fixed mark and a pattern of the reticle positioning mark used by an embodiment of an exposure apparatus according to the present invention.

An alternative embodiment to that of FIG. 7 is shown in FIG. 8, wherein an optical magnification system 171 is provided employing an image sensing element 162, such as a CCD. The system 171 magnifies an image of the reference marks 141 and guides that image to the image sensing element 162. For this embodiment, for example, the annular frame of a square as shown in FIG. 9(a) may be the pattern used for the reference marks 141. A mark symmetrical on the top, bottom, left, and right, such as a cross of three lines (where the thickness of each line is almost identical to the width of the square frame of 9(a) and the entire length of the branch of the cross is longer than the length of one side of the square frame of 9(a)), as shown in FIG. 9(b), may be used as the mark for both the fixed marks 151, 152 and the reticle positioning marks 121a, 121b. The image on the image sensing element 162 thus becomes a superimposed image of both 9(a) and 9(b), as shown in FIG. 9(c).

Figure 9C:
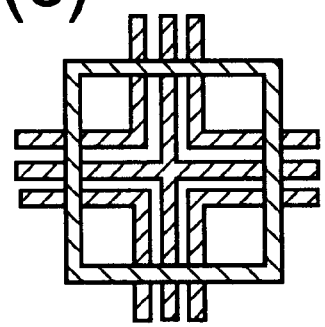
FIG. 9(c) shows the state of a compound image when the pattern of the mark shown in FIG. 9(a) and the pattern of the mark shown in FIG. 9(b) are superimposed.
Figure 10A:
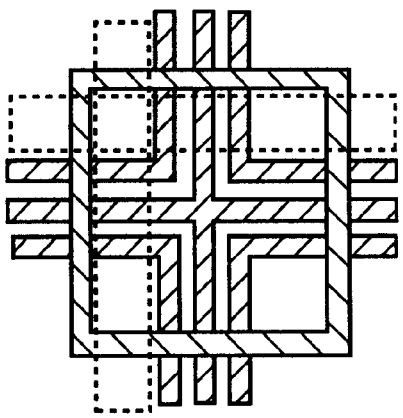
FIG. 10(a) shows the compound image of the pattern shown in FIG. 9(c).
Figure 10B:
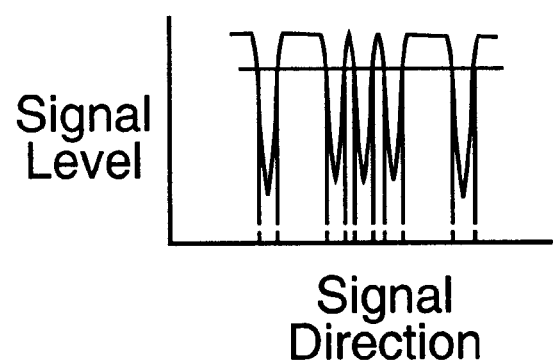
FIGS. 10(b) and 10(c) show representative signals resulting from processing of the compound image.
Figure 10C:
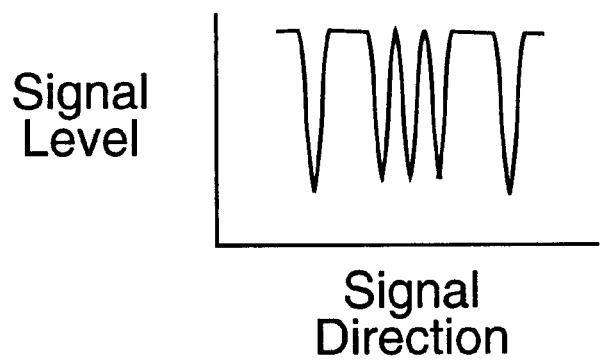

By processing the image shown in FIG. 9(c) in the regions indicated by dotted lines in FIG. 10(a), including the three lines of the cross and the annular frame of the square, it is possible to detect the relative position between the reference marks 141 and the fixed marks 151, 152, or between the reference marks 141 and the reticle positioning marks 121a, 121b. FIGS. 10(b) and 10(c) show the relationship between the image and the signal level when processing the image in the two orthogonal directions along the lengths of the dotted-line-enclosed areas of FIG. 10(a). If the spaces between locations characterized by sudden changes in the signal levels (which sudden changes correspond to lines of the reference marks, the fixed marks, and the reticle positioning marks) are analyzed, the relative positional relationship between each mark can be detected.

In order to avoid thermal expansion caused by excess irradiation when using illumination light from the optical illumination system 100, it is preferable to enclose the irradiation area in the region of each measurement point with a portion of the reticle blind 109 shown in FIG. 1.

Figure 11:
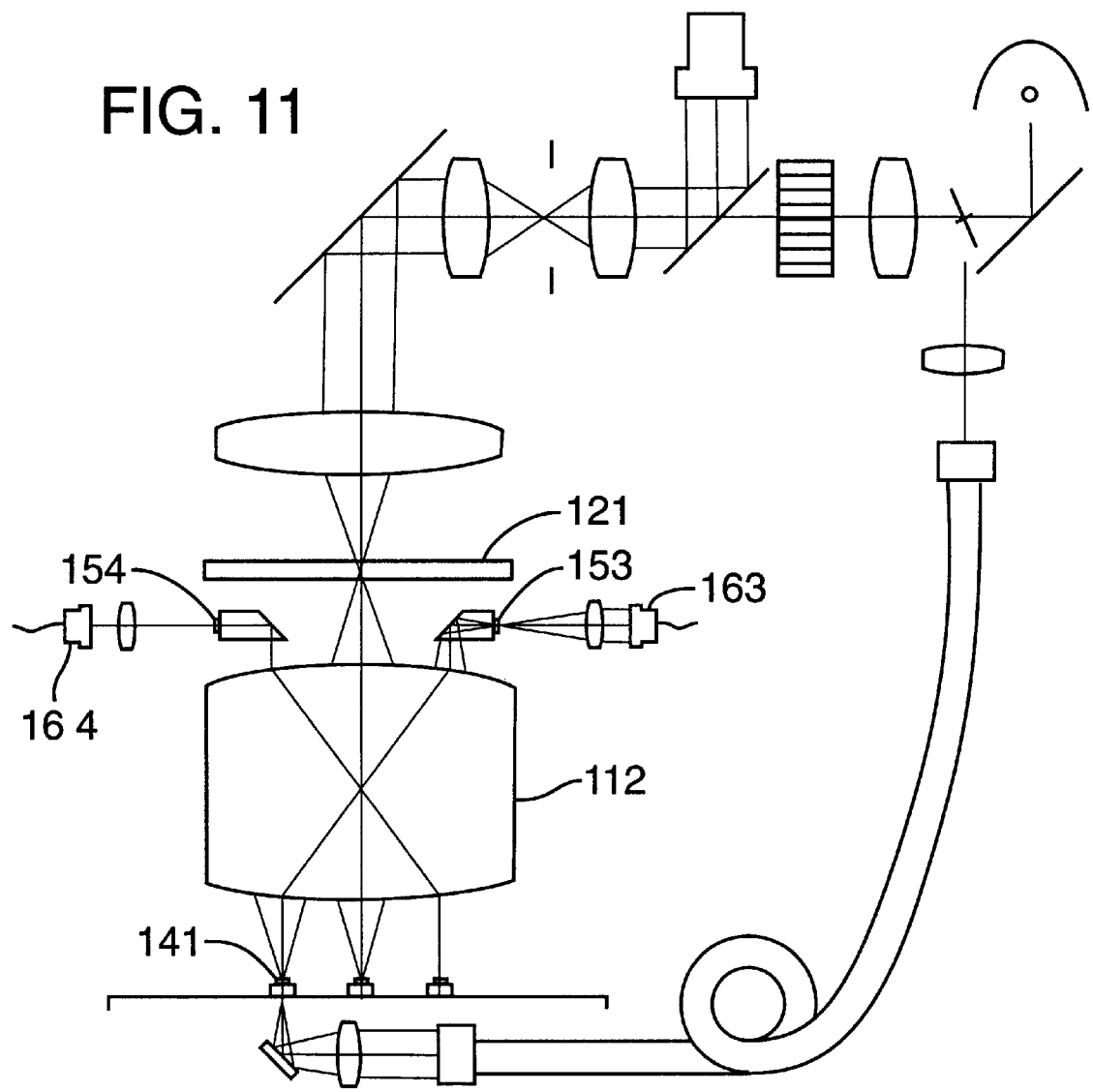
FIG. 11 is a schematic elevational diagram of a first modification of the FIG. 7 embodiment.

Another embodiment related to the embodiment of FIG. 1 is shown in FIG. 11. In the FIG. 11 embodiment, illumination for the reference mark 141 is provided in the same manner as described above with respect to the FIG. 2 embodiment. But, in contrast to the embodiment shown in FIG. 2, the fixed marks 153, 154, each have their own respective light receiving element 163, 164. In this embodiment, it is not necessary to provide an opening through the reticle 121. Marks on the reticle itself are still detected in the manner described above with respect to the embodiment shown in FIG. 2.

The light receiving portion 163 is disposed on the rear side of the fixed mark 153 in the embodiment shown in FIG. 11. However, whenever there are significant thermal effects, it is also possible, as an alternative, to transmit the light using to the light receiving element using an optical fiber.

Figure 12:
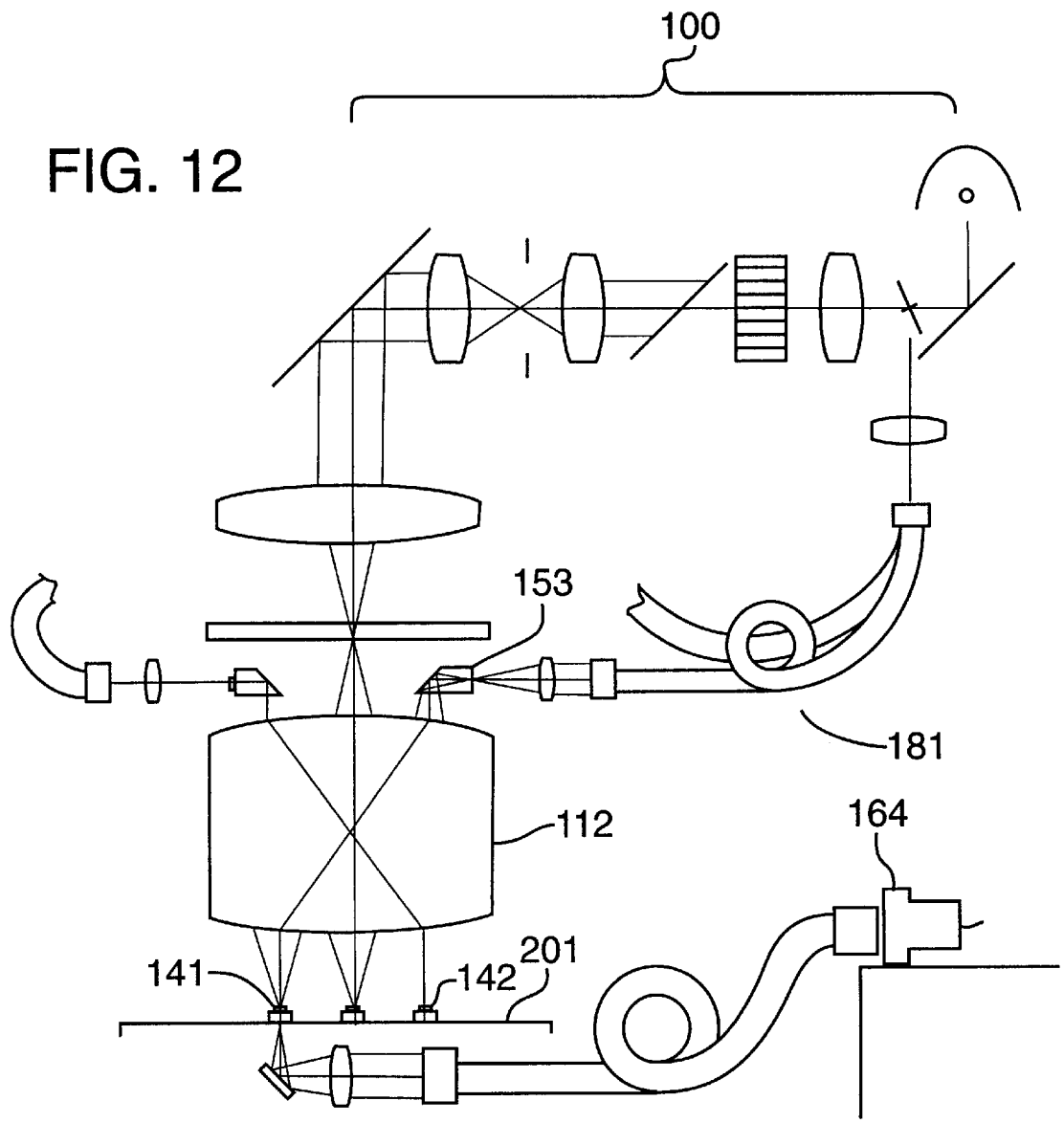
FIG. 12 is a schematic elevational diagram of a second modification of the FIG. 7 embodiment.

Another alternative embodiment related to the embodiment shown in FIG. 1 is shown in FIG. 12. In FIG. 12, the illumination for the fixed mark 153 for detection of the relative position the fixed mark 153 and the reference mark 141 is supplied directly to the fixed mark 153 by an optical fiber, in a manner similar to that by which the reference marks are supplied in the embodiment shown in FIG. 2. The detection of the relative position of the reticle positioning marks 121a, 121b and the reference mark 141 is performed with illumination directly from the optical illumination system. Thus the fixed marks have an independent illumination system 181 while the reticle positioning marks 121a, 121b use the optical illumination system 100.

The FIG. 12 embodiment avoids reductions in the intensity of the illumination at the reticle, which reductions result from increases in the illuminated area required when the illuminated area must include the fixed marks, as in the embodiments shown in FIGS. 7 and 8. As in the embodiment shown in FIG. 8, the embodiment shown in FIG. 12 may use an image sensing element as the light receiving element 164.

Figure 14:
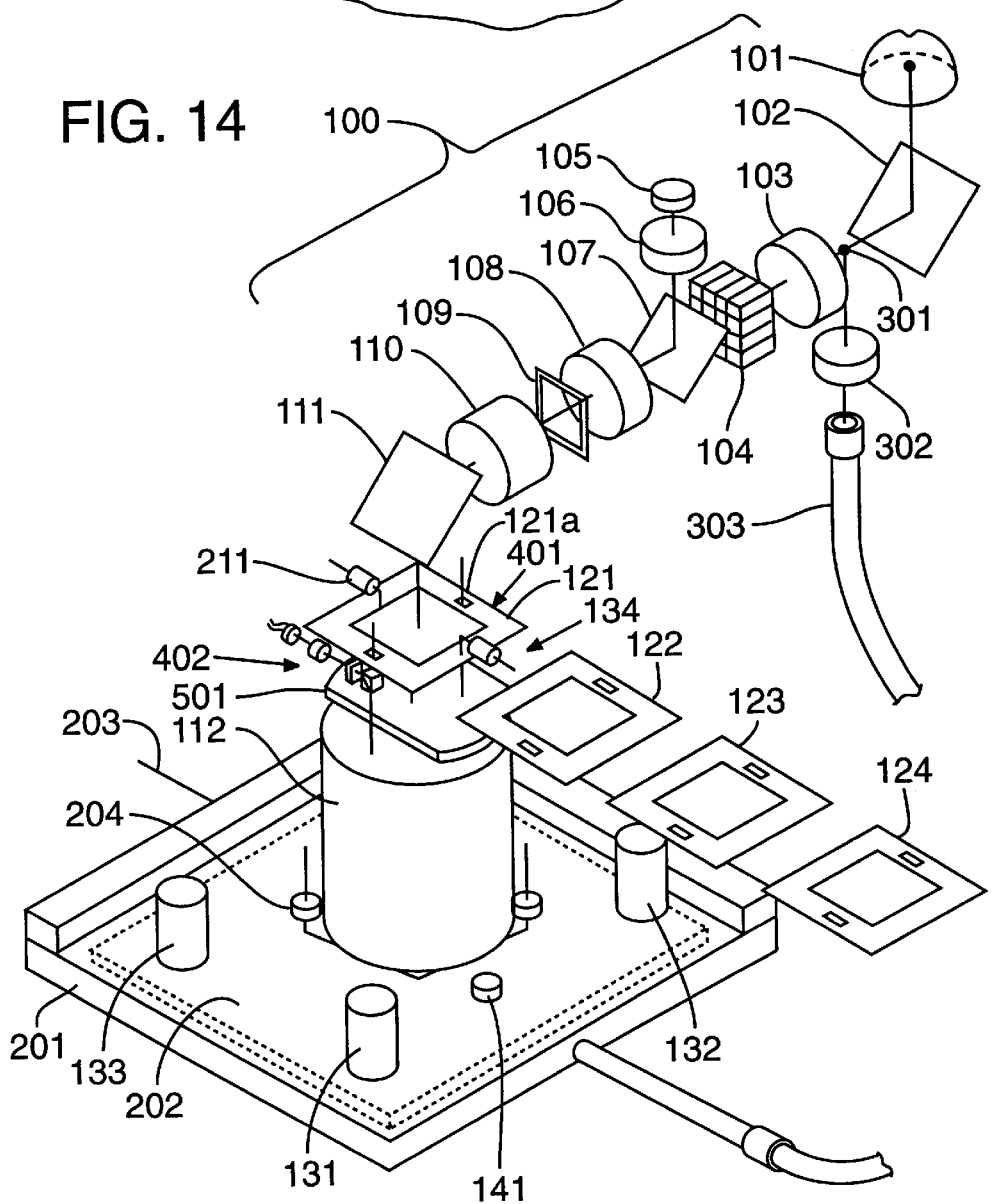
FIG. 14 is a perspective view that schematically shows certain elements of another embodiment of an exposure apparatus according to the present invention.

FIG. 14 is a perspective schematic view that shows certain components of another embodiment of an exposure apparatus according to the present invention. A schematic diagram showing certain components of this embodiment in more detail is provided in FIG. 15.

Figure 15:
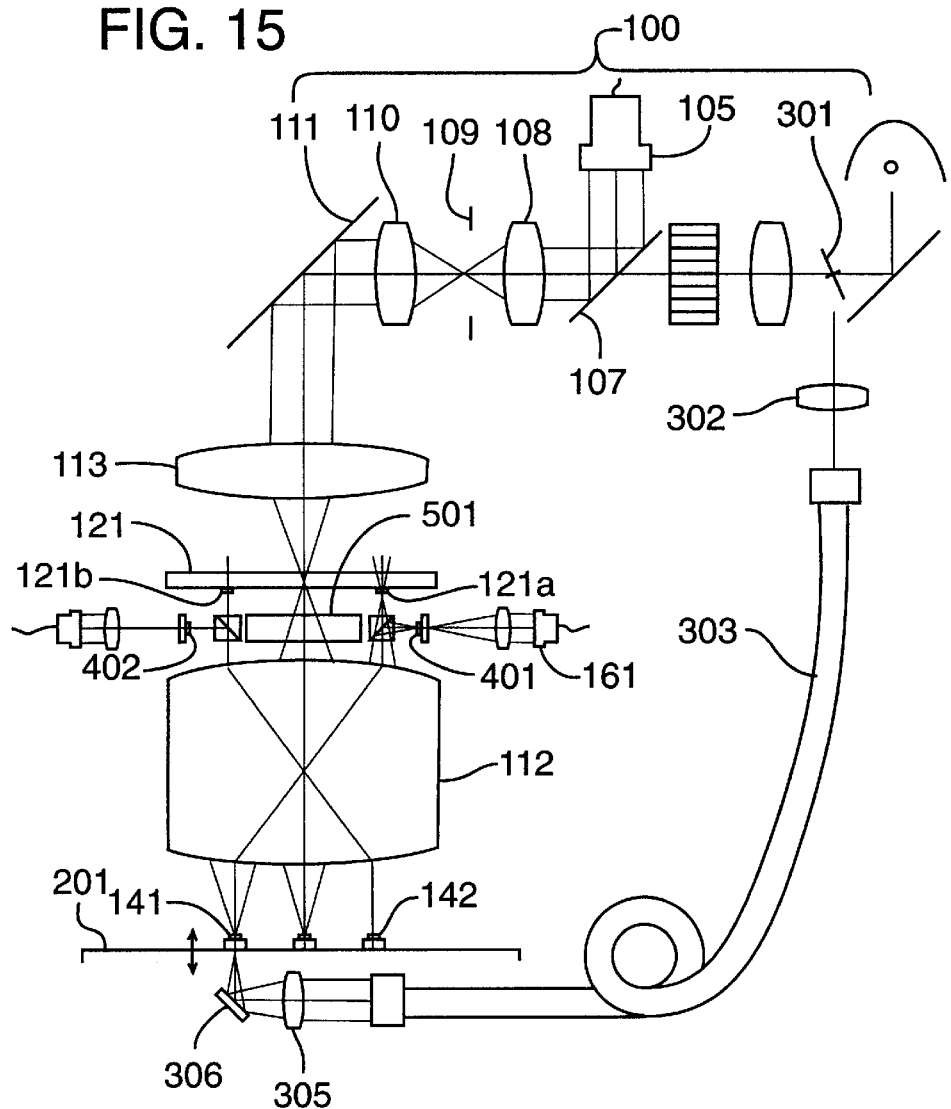
FIG. 15 is a schematic elevational diagram of certain details of the FIG. 14 embodiment.

The embodiment of FIGS. 14–15 includes an optical illumination system 100 corresponding to that described above with respect to FIG. 1, a condenser lens 113 (shown only in FIG. 15), an optical projection system 112, and a plate stage 201. These components are placed in the stated order along the optical axis starting from the light source 101.

A reticle stage (not shown) is disposed in the optical path between the reflecting mirror 111 (or the condenser lens 113) and the optical projection system 112. The reticles 121–124, on which are formed patterns to be projected, are successively loaded on the reticle stage.

A parallel flat plate 501 is disposed in the optical path between the position where the reticle is loaded and the optical projection system 112. The parallel flat plate may be formed from a circular plate with a diameter almost identical to the lens of the optical projection system 112, having a front surface and a rear surface parallel to each other at a given thickness. The circular plate is made into an oblong plate by cutting into it two parallel side surfaces, perpendicular to the circular surfaces of the plate, resulting in the removal of two symmetrical semicircular sections from the circular plate. The resulting oblong plate 501 has a surface area sufficient to cover the exposure region to be exposed on a reticle in the optical projection system.

The parallel flat plate 501 and the optical projection system together form a compound optical system designed to exhibit favorable image forming attributes for light having an exposure wavelength. This compound optical system is arranged such that the exposure surface of a plate 202 loaded on the plate stage 201 and the pattern of the reticle 121 are optically conjugate.

In the embodiment shown in FIGS. 14 and 15, the parallel flat plate 501 is disposed between the optical projection system 112 and the reticle position. However, the flat plate 501 can also be disposed between the optical projection system 112 and the plate 202. In such a configuration, the optical projection system 112 and the flat plate preferably constitute a compound optical system to exhibit favorable image forming attributes together.

The shutter 301 is disposed between the reflecting mirror 102 and the collimator lens 103. The shutter 301 includes mirror surface on the side facing the light source 101. As necessary, the mirror surface may be set at a fixed angle with respect to the optical path of the main illumination system 100 so that light from the light source 101 is directed to the outside of the optical illumination system 100 and converged at the incoming side of the optical fiber 303 by the convergence lens 302. The shutter 301 may be a rotating shutter having multiple (e.g., 3) blades.

The half mirror 107 guides a portion of the light, traveling inside the optical illumination system toward the light source 101, to the outside of the optical illumination system 100 to pass through the lens 106. Light from the lens 106 forms an image on the light receiving surface of the light receiving element 105 such as a photoelectric conversion element. The light receiving surface of the light receiving element 105 is conjugate to the surface of the plate 202. In the embodiment of FIG. 15, the light receiving element 105 is preferably a photomultiplier tube that detects light intensity only, rather than an image sensing element such as a CCD.

Disposed around the optical projection system 112 are four plate alignment systems 131–134, arranged to be positioned slightly inside the four corners of a plate loaded on the plate stage 201 when the plate stage 201 is positioned directly under the optical projection system. (Only three plate alignment systems 131–133, are shown in the figure: item 134 is hidden by the optical projection system.)

A plate interferometer 203 is provided to measure the position of the plate stage using a coordinate system.

The reference mark 141 is disposed on the surface of the plate stage 201 and protrudes from the surface of the stage when a substrate is not loaded, and withdraws inside the stage when a substrate is loaded to prevent interference with the substrate.

An auto-focus system 204 for the optical projection system 112 is disposed between the optical projection system 112 and the plate stage 201.

FIG. 17 shows an enlarged schematic view of the peripheral portion of the parallel flat plate 501. An optical element 412 functioning as a beamsplitter or combiner is disposed at the region of the optical projection system next to the flat surface which was cut into the parallel flat plate 501. The optical element 412 has a boundary surface 413 that is an optical parting line. The optical member 412 is formed, for example, of two prisms, having a cross section of a rectangular equilateral triangle, that are cemented at the inclined plane of each, with a boundary surface 413 of a half mirror formed on that inclined plane.

The optical member 412 intercepts detection light 451, emitted from the optical projection system in the direction toward the reticle parallel to the optical axis, and produces a first light 452 that passes through the boundary surface 413 toward the marks 121a, and a second light 453 that reflects on the boundary surface 413 toward the direction of a fixed mark 401.

The compound optical system comprised of the optical member 412 and the optical projection system 112 is arranged so as to have excellent imaging qualities for light having an exposure wavelength. I.e., the optical properties of the optical member 412 as experienced by light passing through the boundary surface 413, are essentially identical to the optical properties of parallel flat plate 501. The reference mark 141 and the reticle positioning marks 121a, 121b are arranged to be conjugate through the compound system that passes through the boundary surface 413. The parallel flat plate 501 and the optical member 412 preferably have equal powers when combined with the optical projection system 112. In other words, the optical member 412 is preferably made using identical optical glass and having an identical total thickness to that of plate 501. Thus, the reference mark 141 can be used to measure, through the compound optical system, the reticle multiple measurement marks 125 (shown in FIG. 16) formed within the pattern area, in addition to the reticle positioning marks 121a, 121b formed on the frame or peripheral portion, outside the area of the pattern to be transferred.

The fixed marks 401, 402 (in FIG. 14, item 401 is hidden by the reticle 121) are secured to the reticle stage at positions conjugate to the reference mark 141 through the compound optical system that includes the projection system 112 and the optical member 112, with reflection by the boundary surface 413.

Figure 18:
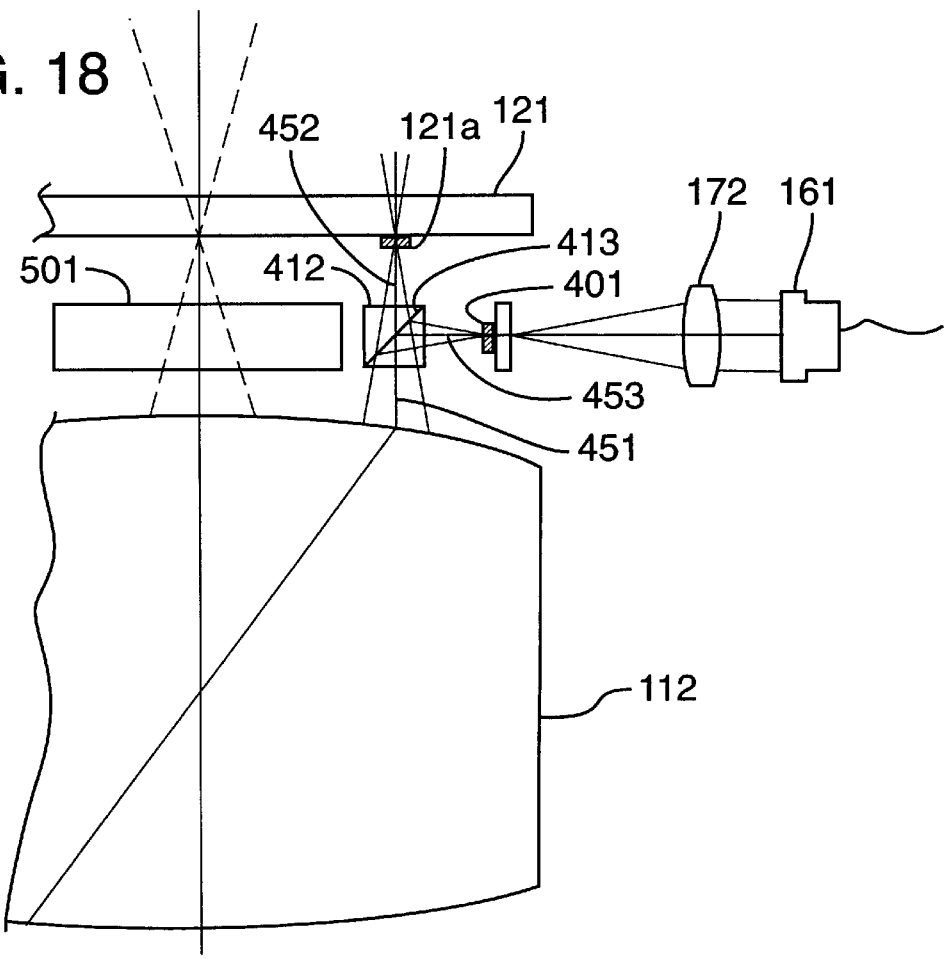
FIG. 18 shows an enlarged schematic diagram of a portion of the exposure apparatus of FIG. 14.

In the embodiment shown in FIG. 18, the boundary surface 413 is a half mirror formed on the junction surface of combined prisms. As an alternative, a thin membrane, stretched over a frame and functioning as a half-mirror, can be used. In this case, the optical power of the thin membrane is virtually zero so that the parallel flat plate 501 is unnecessary.

When projecting and exposing the patterns on the reticles 121–124 onto the plate 202 supported on the plate stage 201, the light of the light source 101 is selected in an exposure wavelength (for example, g-line, h-line, or i-line) by an interference filter (not shown). The interference filter is preferably disposed, for example, in the optical path between the collimator lens 103 and the optical integrator 104. The reticle 121 loaded on the reticle stage is illuminated by the optical illumination system 100, and the pattern on the reticle is transferred by the optical projection system 112 onto the plate 202 (indicated by the dotted lines in FIG. 14). By exposing a plurality of cooperating reticles in precise alignment relative to one another (e.g., the four reticles 121–124), a pattern useful in forming a large liquid crystal display panel may be produced.

To measure the baseline in this exposure apparatus, the plate stage 201 is cleared of any plate resting thereon, and the reference mark 141 is raised such that the surface of the reference mark 141 approximately meets the image plane of the optical projection system 112.

To determine a baseline, the third position detection system is employed to measure the relative position of the fixed marks 401, 402 to the reference marks 141. Nearly simultaneously, the second position detection system is employed to measure the relative position of the reticle positioning marks 121a, 121b to the reference mark 141.

Light reflected a mirror surface of the shutter 301 inside the optical illumination system 100 is guided by the convergence lens 302 to the entrance of the optical fiber 303. The optical fiber 303 guides this light to the vicinity of the reference mark 141 on the plate stage 201. Light from the optical fiber 303 is emitted parallel to the surface of the plate stage 201 and travels through a condenser lens 305. The light is then reflected by a reflecting mirror 306 toward the reference mark 141. This light is then used as illumination light for illumination of the reference mark 141.

The illumination light is selected by an interference filter (not shown) in an exposure wavelength. An image of the illuminated reference mark 141 is formed by the optical projection system 112 on the reticle-facing side thereof. The optical path to this image is divided into two optical paths by the optical member 412, as shown in FIG. 18. Light in one path forms an image on the fixed mark 401, and light in the other path forms an image on reticle the mark 121a, or the reticle positioning mark 121b, on the reticle 121.

As shown in FIG. 18, the light 453 passing through the fixed mark 401 travels through the light receiving lens 171 and is intercepted at a photoelectric conversion element 161 (e.g., a silicon photo diode or similar device). Compared to the boundary surface at the half mirror 107 in the optical illumination system 100, the boundary surface 413 may have about half the transmissivity or less. Thus, the fixed mark 401 can be illuminated by a relatively high intensity of light, thereby making a light receiving element that detects very low intensity light (e.g., a photomultiplier tube) unnecessary. However, a photomultiplier tube can be used, if desired.

As shown in FIG. 15, light passing through the reticle positioning marks 121a or 121b of the reticle travels through a portion of the optical illumination system 100 including, in this embodiment, the condenser lens 113, the reflecting mirror 111, the reticle blind image forming optical system 110, the reticle blind 109 and the relay lens 108. The light is then reflected partially by the half mirror 107 and travels to a light receiving element (a photoelectric conversion element) 105. A photomultiplier tube or similar device can be used as the light receiving element 105. In order to control loss of exposure light inside the optical illumination system 100, the half mirror 107 has a somewhat large transmittance and low reflectance. As a result, a photomultiplier tube or similar device that can detect very low intensity light is preferably used.

Figure 16:
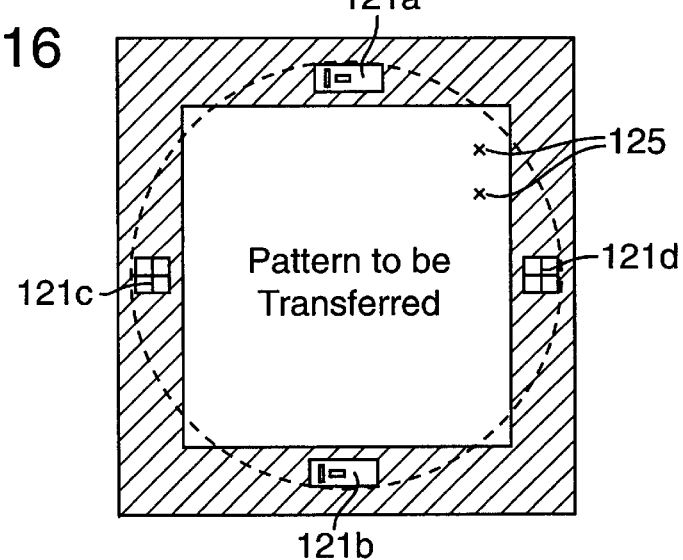
FIG. 16 shows an example of a reticle that may be used by the exposure apparatus of FIG. 14.

FIG. 16 shows an example of the marks formed on the reticles 121–124. Rectangular openings are formed in opposing sides of a square annular frame surrounding the exposure pattern region (shown in FIG. 16 as the blank central region). Within these rectangular openings are formed the marks 121a, 121b used for measuring the position of the reticle relative to the reference mark(s) on the plate stage 121. Square openings are formed in the remaining opposing sides of the frame, which openings include the cross-shaped reticle alignment marks 121c, 121d used for the reticle alignment system. Close to the exposure pattern (represented by the white area in the middle of the reticle) and inside the region to the inside of the annular frame, a plurality of reticle multiple measuring marks 125 are formed (two are shown).

Figure 17A:
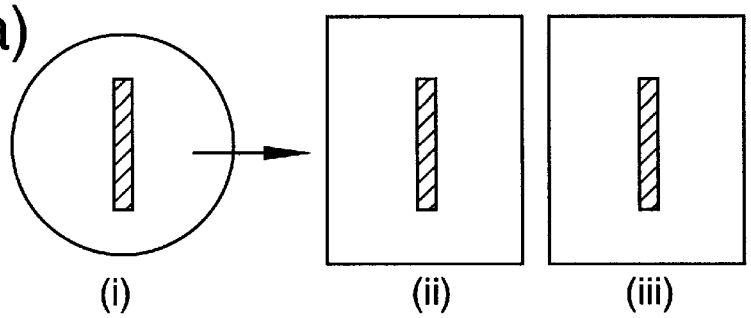
FIG. 17(a) shows one example of a pattern of the reference mark and a pattern of the fixed mark that may be used by the exposure apparatus of FIG. 14.

The patterns preferably used for the reference mark 141, the fixed mark 401, and the reticle positioning marks 121a, 121b are shown in FIG. 17(a) as slit marks i, ii, and iii, respectively. The reference mark 141 is a slit inside a circular field of view as shown by FIG. 17(a)(i). The fixed mark 401 and the reticle positioning marks 121a, 121b are shown as slits with shapes identical to the reference mark slit, but inside a square field of view as shown by FIG. 17(a)(ii) and (iii).

Figure 17B:
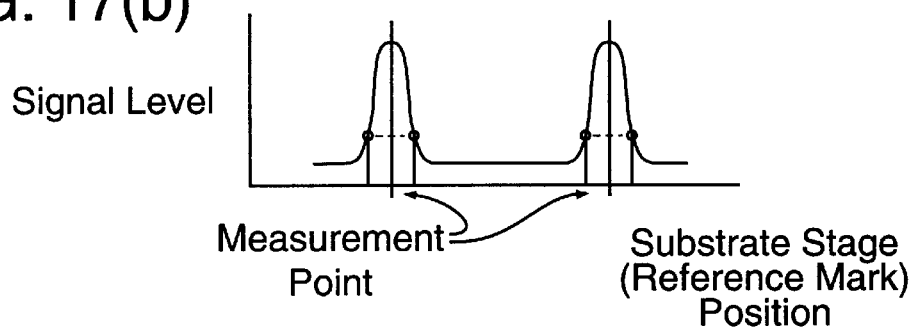
FIG. 17(b) shows an example of a signal detected by a light receiving element when each mark shown in FIG. 17(a) is scanned during operation of the exposure apparatus of FIG. 14.

By scanning the plate stage 201, the slit of FIG. 17(a)(i) moves relative to the slits of FIG. 17(a) (ii) and (iii), as indicated by the arrow in FIG. 17(a). The signals detected by the light receiving element 105, when the slit of the reference mark successively overlaps first the slit of the fixed mark and then the slit of the reticle positioning mark), forms two continuous peak-shaped signals with left and right symmetry as shown in FIG. 17(b). By detecting the midpoint of a slice horizontally cut at a height less than the total height of the peak-shaped signals, the position coordinates of the stage can be measured by the interferometer 203.

Thus, measurements are performed of the relative positions of the fixed marks 401, 402, and the reference mark 141, and the reticle positioning marks 121a, 121b, and the reference mark 141. Two fixed marks are provided because the position of the optical axis of the optical projection system 112 may be represented as a fixed point by arranging the two fixed marks symmetrically about the optical axis of the optical projection system 112. It is possible to measure the x-direction position, the y-direction position, and the rotation $\theta$ of the reticle relative to the plate stage 201 by measuring the reticle at two points, thereby providing sufficient information to correctly position the reticle.

The first position detection system is used to determine the position of the plate alignment systems 131, 132, 133, 134 (in FIG. 14, the plate alignment system 134 is hidden by the optical projection system 112). In like manner to aligning the reticle, this measurement makes it possible to measure the position of the plate alignment system (by, e.g., image processing and ordinary signal processing such as diffraction light detection utilizing laser light) if marks of the type used for carrying out normal plate alignment are arranged at the reference marks 141.

The positions of the reticle multiple measuring marks 125 are measured at multiple points using the reference mark 141. This is done by moving the reference mark 141 to the exposure region covered by the parallel flat plate 501, and obtaining the coordinates of each of the multiple measuring marks 125 using the plate stage interferometer 203. This provides the baseline measurement of the position of the pattern to be transferred, with the reticle 121 positioned as determined by the reticle alignment system 211 and the reticle alignment marks 121c, 121d. Thus the effective relative position of the reticle alignment marks 121c, 121d and the pattern to be transferred is also determined.

Then, the reticle 121 is replaced with the reticle 122. The reticle 122 is positioned, by the reticle alignment system 211 and the reticle alignment marks on the reticle 122 (corresponding to reticle alignment marks 121c and 121d of FIG. 16), at the same position as the reticle 121. The reference mark 141 is used to detect the positions of the fixed mark 401 and one reticle positioning mark of the reticle 122 (corresponding to the mark 121(a)), and the fixed mark 402 and the other reticle positioning mark of reticle 122 (corresponding to the reticle positioning mark 121(b), see FIG. 15). Thus the positions of the fixed marks and the relative positions of the fixed marks and the reticle positioning marks may be measured at the same time.

The difference between the positions of the fixed marks 401, 402 as measured at the time of measuring the reticle positioning marks of reticle 122 is compared to the positions of the fixed marks 401, 402 measured previously. This difference is taken as a drift amount of the reference mark 141. An offset is then added to subsequent measurements employing the reference mark 141. It is acceptable if the offset is controlled such that the difference between the corrected measurement and the actual position indicated by the fixed mark(s) is set to zero.

A plurality of reticle measuring marks 125 of the reticle 122 are then measured using the reference mark 141, and the needed shift in the x- and y-directions and the needed rotation amount for the reticle 122 are calculated based on the measured relative positions of the multiple measuring marks 125.

Next, the reticle 122 is replaced with the reticle 123 and the same measurement process is conducted as for the reticle 122. Then, the reticle 123 is replaced by the reticle 124 and the same measurement process is again conducted. Thus, the proper x- and y-direction and rotational offsets for each of multiple reticles may be found.

Figure 19:
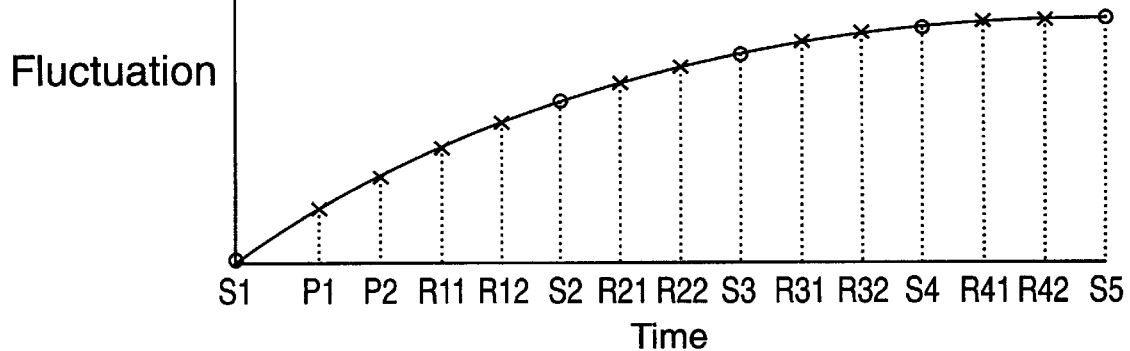
FIG. 19 is a graph showing drift amounts corresponding to baseline measurements of each of plural reticles that may be used in the exposure apparatus of FIG. 14.

The graph in FIG. 19 shows the drift amount obtained corresponding to each reticle during this initial measurement process. The horizontal axis represents time. The positions marked S1 to S5 correspond to the times when the fixed marks are measured, the positions marked R11 to R42 correspond to the times when the reticle positioning marks are measured, and the positions marked P1 and P2 correspond to the times when the plate alignment systems are measured. (P3 and P4, the times for measurement of the third and fourth plate alignment systems, are suitably located during the measurement of the fixed marks, although they are not shown in FIG. 19.) As may be seen from FIG. 19, it is also possible to find the drift amount at each measurement point utilizing, for example, interpolation, such as a direct approximation or secondary approximation. If a suitable interpolation method is used for the drift, even though drift occurs in the reference mark 141, it is possible to keep the effects of the drift at only a very small level. As noted, if the measurement interval of the fixed marks 401, 402 is made shorter, it is possible to find an even more accurate offset amount.

The signal correction system is a control system (not shown in the figures) that receives a position signal from the photoelectric conversion element 105 of FIG. 15 and an output signal from the plate interferometer of FIG. 14 and performs corrections by interpolation as illustrated in the graph of FIG. 19.

The actual exposure is performed using each reticle, previously measured as described above. First, the reference mark 141 moves downward and withdraws into the stage 201. Next, the plate to be exposed is loaded onto the stage 201. Then, based on the measurement value obtained when the multiple measurement points were measured on the reticle 121, an appropriate offset is maintained by the reticle alignment system, and the reticle 121 is moved to the specified position and exposure is performed.

Next, the reticle 121 is replaced with the reticle 122. Again, an offset is added to the reticle alignment system based on the values measured at the multiple measurement points for the reticle 122, and the reticle 122 is moved to the specified position and exposure is carried out. In like manner, the exposure operation is repeated for the reticles 123, 124.

The above-mentioned description is for a first exposure. For a second exposure (i.e., an overlay exposure), before the exposure is made on the reticle, the substrate is positioned by measuring a plate alignment mark exposed during the first exposure, using the plate alignment system.

When the apparatus is continuously used, the baseline is measured once again at, for example, the end of the load. At this time, by using the reference mark 141 to measure the fixed marks 401, 402 and the reticle positioning marks, without carrying out the full baseline measurement described above, the gap between each mark can be re-calibrated without measuring the reticle multiple measuring marks 125. In short, once a baseline has first been measured for a set of reticles, it is acceptable, at least for shorter term re-calibration purposes if the positions of the fixed marks 401, 402, the positions of the reticle positioning marks 121a, 121b, and the positions of the plate alignment systems 131–134 are measured using the reference mark 141.

Figure 20:
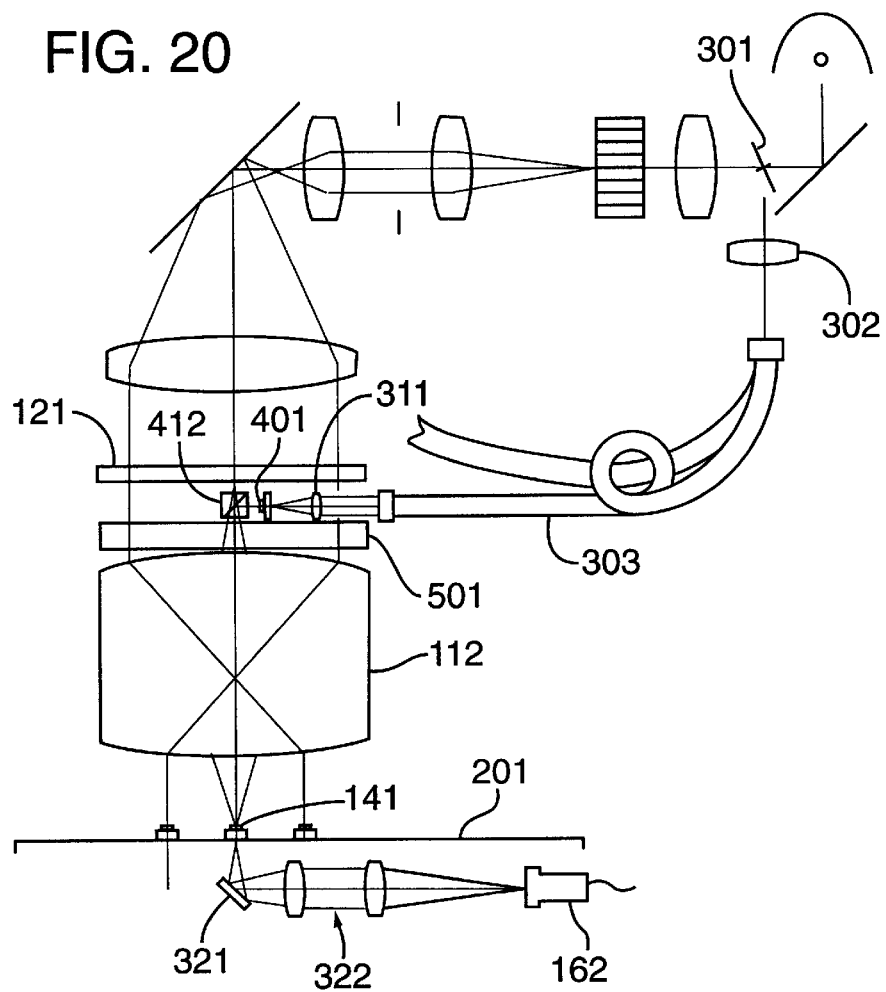
FIG. 20 is a schematic diagram showing another embodiment of an exposure apparatus of the present invention having certain similarities to the FIG. 14 embodiment.

FIG. 20 shows another embodiment of the present invention related to the embodiment shown in FIG. 14. The FIG. 20 embodiment comprises an independent fixed mark illumination system that independently illuminates the fixed mark 401. The fixed mark illumination system is arranged such that the shutter 301 directs light out from the main optical illumination system through the convergence lens 302 to the optical fiber 303. The optical fiber 303 guides the light to a position between the reticle 121 and the optical projection system 112. The fixed mark 401 and the optical member 412 are arranged as shown in FIG. 18. (The fixed mark 401 and the optical member 412 have been displaced upward, and the plate 501 displaced downward in FIG. 20 for ease of illustration only. These elements are actually located in the same plane, i.e., a plane perpendicular to the optical path from the reticle to the plate stage, as is shown in FIG. 18. The mark 401 and the member 412 shown in FIG. 20 are actually in front of the plate 501.)

In the embodiment shown in FIG. 20, the optical member 412 functions not as an optical dividing member but as a combiner. Light from the optical fiber 303 is directed onto the fixed mark 401 by the condenser lens 311. Light from the fixed mark 401 is reflected on the boundary surface 413 of the optical member 412 (see FIG. 18) toward the optical projection system 112.

The main optical illumination system 100 is used to illuminate the reticle multiple measuring marks 125 and the reticle positioning marks 121a, 121b. The light from these marks passes through the boundary surface 413 of the optical member 412 toward the optical projection system 112.

Because the fixed mark 401 and the various marks on the reticle and the reference mark 141 on the plate stage 201 are arranged in a conjugate relationship, the fixed mark 401 and the marks on the reticle form images on the reference mark 141 through the optical projection system 112 and the optical element 412. These images are detected by an image detection system which, in this embodiment, comprises a reflecting mirror 321 and an optical magnification system 322 embedded in the stage 201, and an image sensing element 162. The image formed on the reference mark 141 and the image of the reference mark 141 are formed on the image sensing element 162 through the reflecting mirror 321 and the optical magnification system 322. The images are detected by the image sensing element 162. The reticle positioning mark 121a and the fixed mark 401 can be observed at the same time in this embodiment, as in the embodiment shown in FIGS. 14 and 15.

Figure 21:
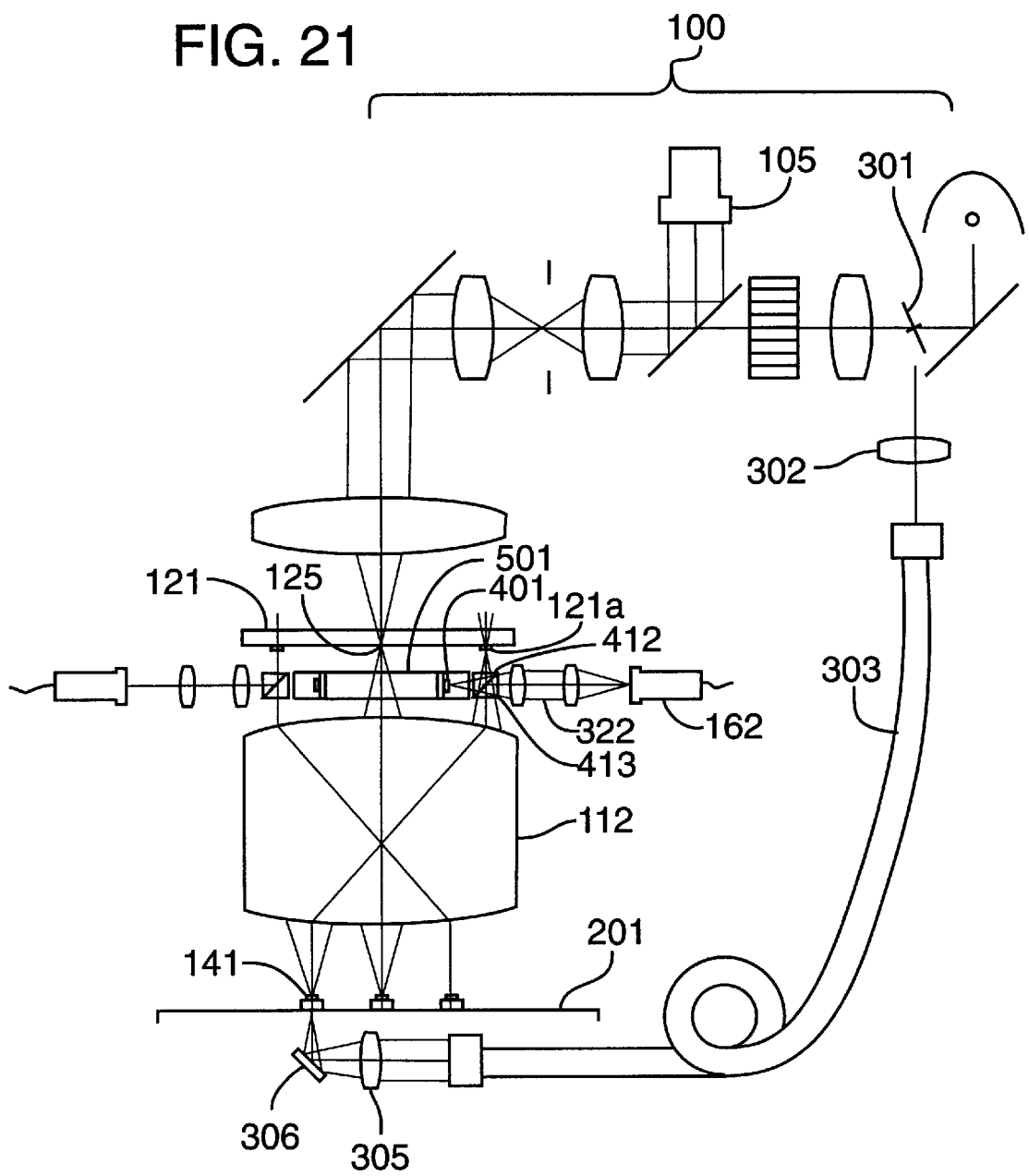
FIG. 21 is a schematic elevational diagram showing yet another embodiment having certain similarities to the FIG. 14 embodiment.

FIG. 21 shows another embodiment according to the present invention related to the embodiment shown in FIGS.

14 and 15. In a manner similar to that shown in FIG. 15, light reflected by the shutter 301 inside the main optical illumination system 100 is guided to the reference mark 141 on the stage 201 through the convergence lens 302, the optical fiber 303, the condenser lens 305, and the reflecting mirror 306. The reference mark is thus illuminated by illumination light, which is selected in an exposure wavelength by a filter (not shown).

In the FIG. 21 embodiment, the optical member 412 is disposed between the optical projection system 112 and the position where the reticle 121 is loaded. The boundary surface 413 of the optical member 412 is arranged such that light coming from the plate stage 201 and passing through the optical projection system 112 is reflected in a direction toward and perpendicular to the nearest of the two parallel side surfaces of the parallel flat plate 501. The fixed marks 401 are formed on a square glass plate of which the length of one side equals the thickness of the parallel flat plate. These square glass plates are attached to the parallel side surfaces of the parallel flat plate.

One image of the reference mark 141 is formed on the fixed mark 401 by light reflected by the boundary surface 413. Another image of the reference mark 141 is formed on the reticle positioning mark 121a by light passing through the boundary surface 413.

The image sensing element 162, such as a CCD, is disposed at a position conjugate to the position of fixed mark 401, when considered through an optical magnification system 322 and through optical member 412, passing through the boundary surface 413. The position of the reticle positioning mark 121a is also conjugate to the position of the image sensing element 162, through the optical magnification system 322 and through optical element 412, but reflecting in the boundary surface 413. Thus, the images of the fixed mark 401, the reticle positioning mark 121a, and the reference mark 141 are all combined and overlaid on the image sensing element 162.

For measuring multiple measurement marks 125, the reference mark 141 is illuminated, and an image of the reference mark 141 is formed, through the optical projection system 112 that includes the parallel flat plate 501, on one of the reticle multiple measuring marks 125 located on the reticle 121. As in the embodiment discussed above in relation to FIG. 15, an image of one of the reticle multiple measuring marks, together with an image of the reference mark 141, is transmitted through a portion of the optical illumination system 100, and reflected by the half mirror 107, to the photoelectric conversion element 105, such as a photomultiplier tube.

Figure 22:
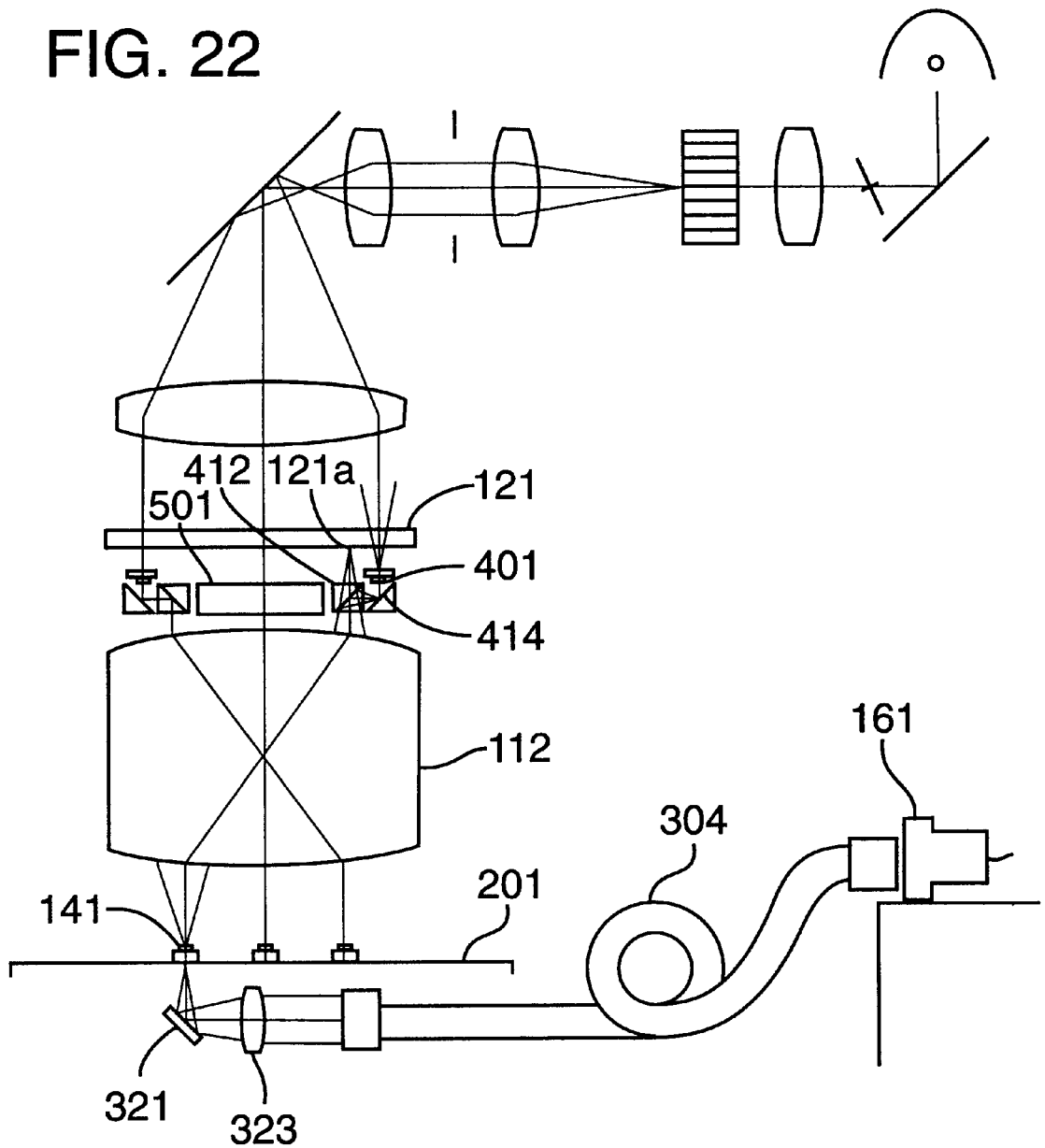
FIG. 22 is a schematic elevational diagram showing yet another embodiment having certain similarities to the FIG. 14 embodiment.

FIG. 22 shows another embodiment of the present invention related to the embodiment shown in FIG. 14. In the embodiment shown in FIG. 22, the reticle positioning mark 121a and the fixed mark 401 are illuminated with light from the main optical illumination system. The light passing through the fixed mark 401 is reflected by the mirror 414 to the optical element 412, at which a portion of the light is reflected toward the optical projection system 112. A portion of the light passing through the reticle positioning mark 121a travels through the optical element 412 toward the optical projection system 112. The optical element 412 thus combines light from the reticle positioning ark 121a and the fixed mark 401. Both the reticle positioning mark 121a and the fixed mark 401 are at locations conjugate to the location of the reference mark 141. Images of the reticle positioning mark and the fixed mark are formed on the reference mark by the optical projection system 112.

The reflecting mirror 321, the collimator lens 323, and the optical fiber 304 are disposed on the side of the reference mark 141 opposite the optical projection system 112. The reflecting mirror 321 reflects light from the reference mark 141 toward the collimator lens 323 in a direction parallel to the plate stage 201. The collimator lens 323 collimates the deflected light. The optical fiber 304 intercepts and guides the light to the photoelectric conversion element 161. In this embodiment, in order to reduce thermal expansion caused by heat generated by the photoelectric conversion element 161, the element is disposed at a location where thermal effects are absent, and the optical fiber 304 guides the light to that location. Alternatively, the photoelectric conversion element 161 can be disposed within the stage 201.

Figure 23:
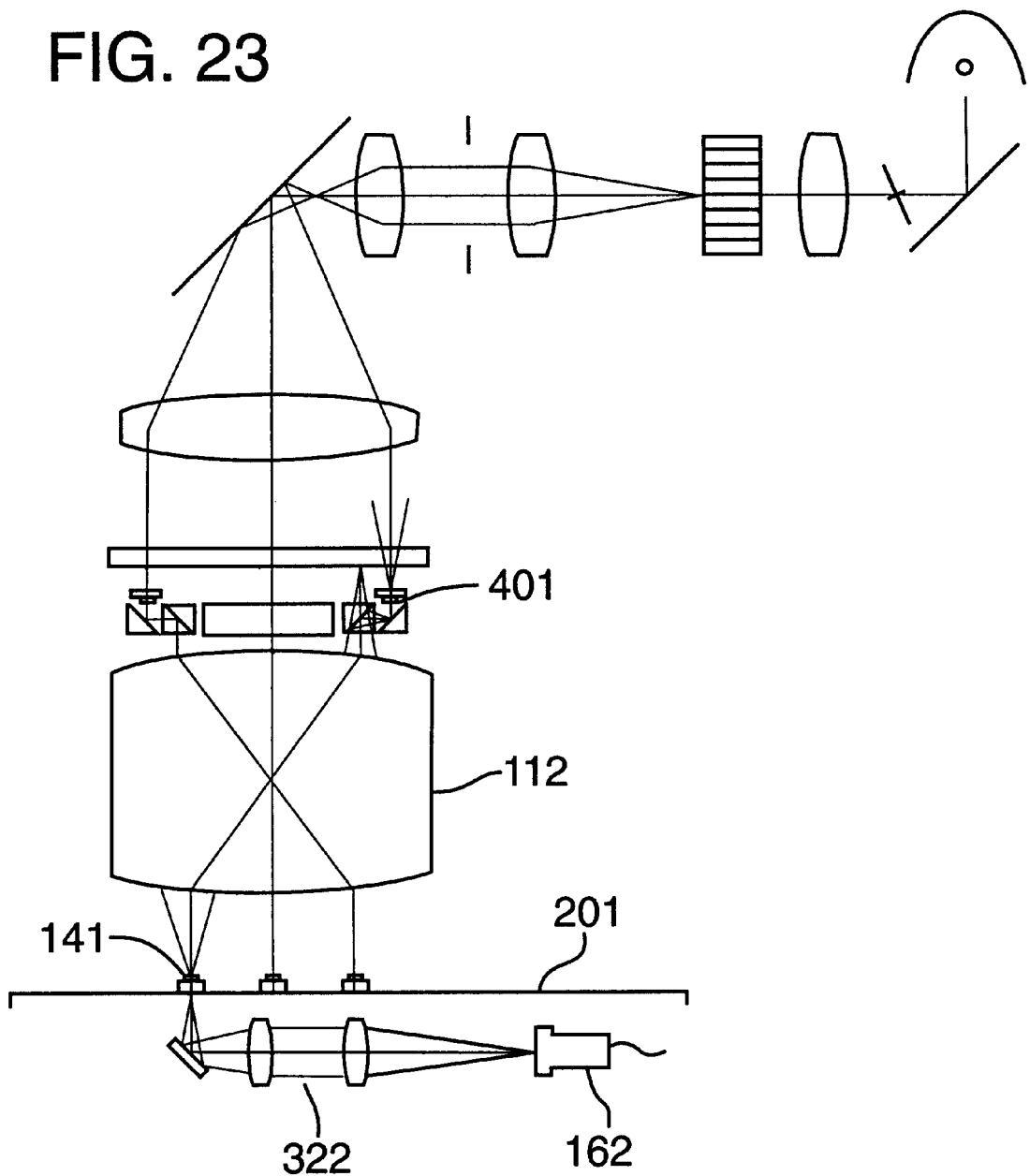
FIG. 23 is a schematic elevational diagram of a modification to the exposure apparatus of FIG. 22.

FIG. 23 shows an embodiment of the present invention similar to that shown in FIG. 22. In the FIG. 23 embodiment, an optical magnification system 322 is provided that focuses an image of the reference mark 141 and the other marks being measured onto the image sensing element 162, such as a CCD, embedded in the stage 201.

Figure 24:
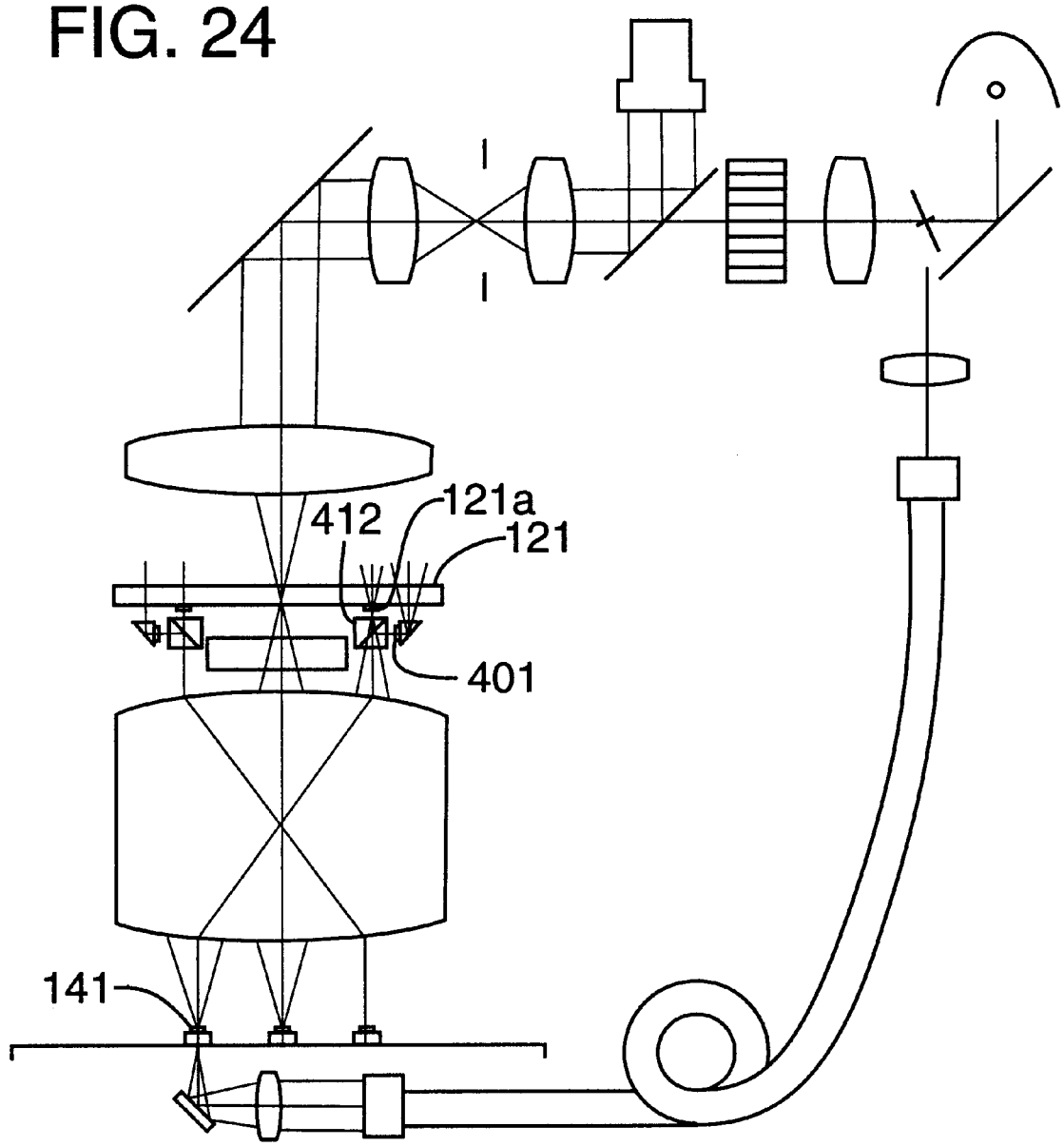
FIG. 24 is a schematic elevational diagram of another modification to the exposure apparatus of FIG. 22.

FIG. 24 shows another embodiment of the present invention similar to that shown in FIG. 22. This embodiment varies from that of FIG. 22 in that, in the FIG. 24 embodiment, the reference mark 141 is illuminated from below the plate stage, as in the embodiments described above with respect to FIGS. 2 and 15. Light from the marks to be measured is received at a light receiving element 105. This embodiment also varies from that of FIG. 22 in that, in the FIG. 24 embodiment, the fixed mark 401 is formed on the exit surface of an equal-sided prism having a cross section of a rectangular equilateral triangle, the exit surface being directed toward the optical member 412. The fixed mark 401 and the reticle positioning mark 121a are both conjugate to the reference mark 141.

Figure 25:
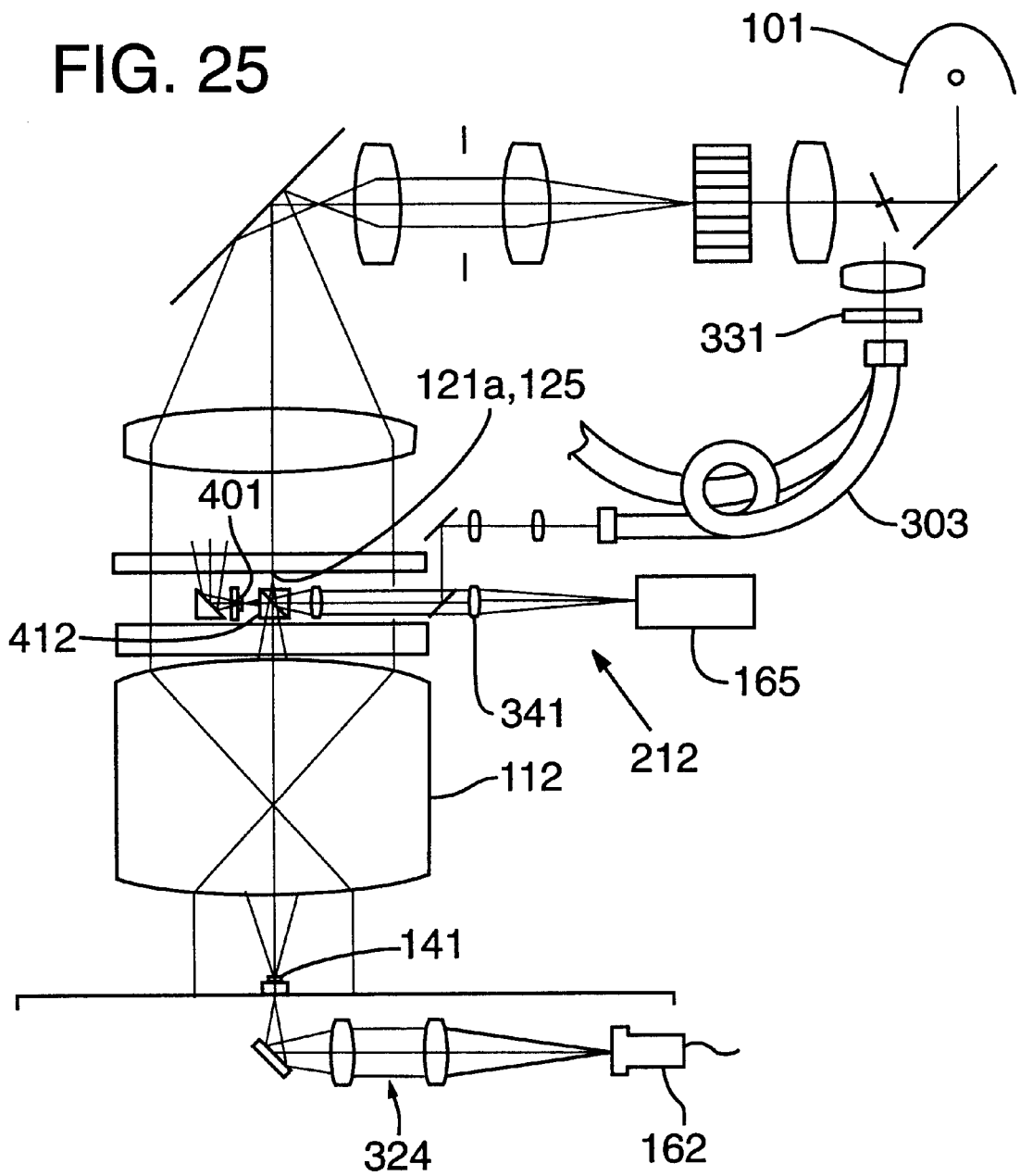
FIG. 25 is a schematic elevational diagram of yet another embodiment having certain similarities to the FIG. 14 embodiment.

FIG. 25 shows another embodiment according to the present invention, related to the embodiment shown in FIG. 14. In this embodiment, the reference mark 141, the fixed mark 401, and the reticle positioning mark 121a are compared either simultaneously or in one short motion of the plate stage. A light receiving system 324 is disposed on the side of reference mark 141 opposing optical projection system 112. A reticle alignment system 212 is also included. The reticle alignment system 212 can regularly measure the reticle positioning mark 121a and the fixed mark 401, including during exposures. In this embodiment, the reticle positioning mark is used also to perform reticle alignment, as was the reticle alignment mark in the embodiments described previously.

Each image of a mark formed on the reference mark 141 is re-imaged, with the image of reference mark 141, onto the image sensing element 162 through the optical magnification system 324. Light from the main optical illumination system is used, with the reference mark 141, both to simultaneously measure the relative positions of the fixed mark and the reticle positioning mark 121a, and to measure the relative positions of the reticle multiple measuring marks 125.

Although an image sensing element 162 is used in this embodiment, stage scanning with marks in the form of slits or similar forms may also be used.

In this embodiment, the reticle positioning mark 121a and the fixed mark 401 can also be regularly observed and measured, even during exposure, using a particular embodiment of a reticle alignment system 212.

In the reticle alignment system 212, an interference filter 331 provides light, having a wavelength outside of the exposure light wavelength(s), from the light source 101. The optical fiber 303 guides the light to the reticle alignment system 212. The reticle positioning mark 121*a* and the fixed mark 401 are illuminated by light inside the reticle alignment system 212 through the optical element 412. The image of each mark is combined by the same optical element 412, and the combined images of each mark are then detected by a CCD 165 through an objective lens 341.

When used in this manner, the reticle positioning mark 121*a* and the fixed mark 401 are necessarily at least somewhat reflective for light of the wavelength employed. And as will be apparent to one of ordinary skill in the art, any of the reference marks useful in the present invention may be arranged as transmissive marks, reflective marks, or marks that are both reflective and transmissive, as desired.

The wavelength of the light inside the reticle alignment system 212 is not an exposure wavelength because observations are also possible during exposure. However, light having a wavelength identical to exposure light may be provided by a separate light source, (not shown), if desired. In order to implement photosensitive steps during the exposure, the alignment light must not reach the plate 202 (FIG. 14). A shutter (not shown), e.g., a shutter disposed between the optical member 412 and the optical projection system 112, may be used to prevent such light from reaching the plate 202. If a separate light source is provided, the reference mark 141 on the stage, the reticle positioning mark 121*a*, and the fixed mark 401 can also be measured by using the illumination system of the reticle alignment system 212 without using light from the main optical illumination system.

In this embodiment, even during exposure, reticle alignment can be carried out without being affected by changes occurring over time, such as deformation, of the reticle alignment system 212, because the positioning of the reticle can at all times be compared to two fixed marks, and need not rely upon a separate index mark within the reticle alignment system. Use of the fixed marks in this manner also increases the reliability and maintainability of the apparatus.

As with many of the other embodiments, because it is possible to detect the fixed mark and the reticle positioning mark at almost the same time using the reference mark 141, measurement time can be shortened, particularly the baseline measurement time.

When the reference mark 141 is raised to detect the relative positions of the fixed marks, the reticle positioning marks, and the plate alignment systems, the time required to measure the relative position of each reticle and the position of the plate alignment system grows longer with increases in the number of reticles.

The effects of external forces caused by movement of the stage and thermal factors can lead to large drift of the reference mark itself. However, with apparatus according to the present invention, the effects of drift when measuring the baseline for multiple reticles are only experienced for one reticle. Such effects are experienced for a very short interval between the measurement of the fixed mark and the reference mark and the final measurement of the reticle. By approximating the drift between the points at which the fixed mark is measured, an even finer drift amount can be estimated and compensated.

Although the parallel flat plate 501 and the fixed mark 401 are shown as separate bodies in the above embodiments, they can be formed integrally. The parallel flat plate 501 can be arranged between the plate stage 201 and the optical projection system 112, if desired.

In order to allow measurements of identical (or conjugate) surfaces, the reference mark 141 is raised up to a height that matches the surface of the plate. Also, the reticle multiple measuring mark 125 and the thickness of the optical member 412 are determined such that the reference mark 141 is conjugate to the reticle positioning mark 121*a*, the fixed mark 401, and the reticle multiple measuring marks 125.

Drift can arise from changes over time of the reference mark when measuring the baseline for a plurality of reticles. Drift can also arise from fluctuations, vibrations, or deformations of the reticle alignment system that performs reticle alignments during an exposure. Drift can also arise from changes in the characteristics of the optical projection system.

The foregoing embodiments other than the FIG. 25 embodiment comprise a reticle position measurement means and a separate, conventional reticle alignment system. While measuring the baseline, the proper operation of the reticle alignment system can also be independently checked, if desired.

Any of the apparatus of this invention preferably includes multiple fixed marks. Even though a slight drift occurs in the fixed marks on an annual basis, for example, if a designated reticle (test reticle) is used, calibration can be easily performed by comparing the position of the fixed mark in the apparatus and the designated reticle (test reticle).

By measuring the fixed marks arranged at two locations using the reference marks, the reference marks can also be used for calibrating the magnification of the optical projection system. Also, using the measurement system between the fixed mark and the reference mark, changes in signal strength caused by up-and-down movement of the plate stage may be measured to obtain the best focus position of the optical projection system, in order to calibrate an oblique-incidence or other type of auto-focus system.

The fixed marks are preferably fixed to the apparatus (in contrast to being located on a removable and moveable reticle). Drift could arise in the reference marks on the plate stage. However, due to the structure of the reference marks that allows the reference marks to move up and down, such drift would have virtually no influence on the measurement of the relative position relationship of the marks.

The embodiment described relative to FIG. 14 and related embodiments comprise a beamsplitter and a parallel flat plate. Thus, the multiple reticle positioning marks in the exposure region on the reticle, the reference mark on the plate stage, the reticle positioning mark on the reticle, and the fixed mark can all be made optically conjugate while making the pattern used for exposure of the reticle and the exposure surface of the substrate optically conjugate.

Having illustrated and demonstrated the principles of the invention, it should be apparent to those skilled in the art that the embodiments of the invention can be modified in arrangement and detail without departing from such principles. I claim as the invention all that comes within the scope of the following claims.

What is claimed is:

1. A projection exposure apparatus, comprising:
   (a) an exposure illumination system that illuminates with exposure light a reticle defining a pattern;
   (b) an optical projection system that forms an image of the pattern on the reticle onto a photosensitive substrate;
   (c) a plate stage for supporting the photosensitive substrate, the plate stage being moveable along an image plane of the optical projection system;

(d) a reference mark disposed on the plate stage, (e) a first position detection system for detecting the position of the photosensitive substrate and detecting the position of the reference mark;

(f) a second position detection system for detecting the relative position between the reference mark and the reticle;

(g) a fixed mark positioned between the position where the reticle is loaded for pattern projection and the optical projection system;

(h) a third position detection system that detects the relative position between said reference mark and said fixed mark; and (i) a signal correction system that, based on information related to the relative position of the reference mark and the fixed mark obtained by the third position detection system, corrects at least one of (1) the detected relative position of the reference mark and the photosensitive substrate, as detected by the first position detection system, and (2) the detected relative position of the reference mark and the reticle, as detected by the second position detection system.

2. The apparatus of claim 1, wherein the reference marks are structured to withdraw from the image plane of the optical projection system into the plate stage.

3. The apparatus of claim 1, wherein the third position detection system comprises a reference mark illumination system that is arranged to be used also with the second position detection system, the reference mark illumination system illuminating a reticle positioning mark formed on the reticle by light possessing an exposure wavelength through the optical projection system when the second position detection system detects the relative position between said reference mark and said reticle, and illuminating the fixed mark through the optical projection system by light possessing an exposure wavelength when the third position detection system detects the relative position between the reference mark and the fixed mark.

4. The apparatus of claim 3, wherein the third position detection system comprises a photoelectric detector disposed inside the exposure illumination system, the third position detection system being arranged to intercept light, traveling through a portion of the exposure illumination system, from an image of the reference mark, formed on the fixed mark by the optical projection system.

5. The apparatus of claim 1, wherein the exposure illumination system is arranged to illuminate the reticle positioning mark and the reference mark through the optical projection system, and to illuminate the fixed mark and the reference mark through the optical projection system, the third position detection system comprising a photoelectric detector that is arranged to be used with the second position detection system also, the photoelectric detector being arranged to intercept light from an image of the reticle positioning mark formed on the reference mark by the optical projection system when the second position detection system detects the relative position of the reference mark and the reticle, and the photoelectric detector being arranged to intercept light from an image of the fixed mark formed on the reference mark by the optical projection system whenever the third position detection system detects the relative position of the reference mark and the fixed mark.

6. The apparatus of claim 1, wherein:

the exposure illumination system is arranged to illuminate the reticle positioning mark and the reference mark through the optical projection system, the third position detection system comprises a fixed mark illumination system that illuminates the fixed mark and the reference mark through the optical projection system, the third position detection system comprising a photoelectric detector arranged to be used in conjunction with said second position detection system also, the photoelectric detector being arranged to intercept light from an image of the reticle positioning mark formed on the reference mark through the optical projection system when the second position detection system detects the relative position of the reference mark and the reticle, and to intercept light from an image of the fixed mark formed on the reference mark by the optical projection system whenever the third position detection system detects the relative position of the reference mark and the fixed mark.

7. The apparatus of claim 6, wherein the third position detection system comprises a light guide that is arranged for use in conjunction with the second position detection system, and is positioned between the reference mark and the photoelectric detector.

8. The apparatus of claim 5, wherein the third position detection system comprises a light guide that is arranged for use in conjunction with said second position detection system, and is positioned between the reference mark and the photoelectric detector.

9. The apparatus of claim 8, further comprising an optical magnification system that forms a magnified image of the fixed mark and the reference mark onto the light receiving surface of the photoelectric detector.

10. The apparatus of claim 7, further comprising an optical magnification system that forms a magnified image of the fixed mark and the reference mark onto the light receiving surface of the photoelectric detector.

11. An exposure apparatus, comprising:

(a) an exposure illumination system for using exposure light to illuminate a reticle whereon is formed a specified exposure pattern;

(b) an optical projection system for forming a an image of the exposure pattern onto a photosensitive substrate;

(c) a plate stage that is arranged to support a photosensitive substrate and move along an image plane of the optical projection system;

(d) a reference mark disposed on the plate stage;

(e) a first position detection system for detecting the position of the first detection system relative to the reference mark and for detecting the position of the photosensitive substrate;

(f) a second position detection system for optically detecting the relative position of the reference mark and the reticle through a first optical detection path formed between the reference mark and the reticle, the first path passing through the optical projection system;

(g) a fixed mark positioned between the position where the reticle is loaded and the optical projection system;

(h) a third position detection system for optically detecting the relative position of the reference mark and the fixed mark through an second optical detection path formed between the reference mark and the fixed mark, the second path passing through the optical projection system;

(i) a signal correction system that, based on information related to the relative position of the reference mark and the fixed mark obtained by the third position detection system, corrects at least one of (1) the relative position of the photosensitive substrate and the reference mark, as detected by the first position detection system, and (2) the relative position of the reference mark and the reticle positioning mark, as detected by the second position detection system;

(j) a parallel flat plate disposed within an exposure optical path between either the position where the reticle is loaded and the optical projection system or between the optical projection system and the plate stage; and (k) an optical member, capable of acting as a beamsplitter or a combiner, and positioned near said parallel flat plate but outside the exposure optical path;

(l) wherein the optical member forms part of the first optical detection path of the second position detection system, and part of the second optical detection path of the third position detection system, the reticle positioning mark and the reference mark being optically conjugate through the first path, and the fixed mark and the reference mark being optically conjugate through the second path, and the reticle and an exposure surface of the photosensitive substrate being optically conjugate through the parallel plate together with the optical projection system.

12. The apparatus of claim 11, wherein:

the reference mark is disposed at a position where the height of the exposure surface of the photosensitive substrate retained on the plate stage is about identical to the height of the reference mark, the second position detection system is arranged to detect the relative position of the reference mark and the reticle positioning mark formed using light having an exposure wavelength, and the third position detection system is arranged to detect the relative position of the reference mark and the fixed mark using light having an exposure wavelength.

13. The exposure apparatus of claim 11, wherein the second and third position detection systems are arranged such that the relative positions detected by the second position detection system and the third position detection system may be detected at almost the same time.

14. The exposure apparatus of claim 11, wherein:

the third position detection system comprises a reference mark illumination system arranged to be used in conjunction with the second position detection system also, the reference mark illumination system is arranged to illuminate the reference mark, and, through the optical projection system and the optical member, the reticle positioning mark, using light having an exposure wavelength, whenever the second position detection system detects the relative position of the reference mark and the reticle, the reference mark illumination system is arranged to illuminate the reference mark, and, through the optical projection system and the optical member, the fixed mark, using light having an exposure wavelength, whenever the third position detection system detects the relative position of the reference mark and the fixed mark.

15. The apparatus of claim 14, wherein:

the third position detection system comprises a photoelectric detector disposed inside the exposure illumination system and arranged to be used also in conjunction with the second position detection system, the photoelectric detector receiving light traveling through a portion of the exposure illumination system from an image of the reference mark formed on the fixed mark by the optical projection system and the optical member.

16. The exposure apparatus of claim 11, wherein the exposure illumination system is arranged to illuminate the reticle positioning mark, and, through the optical projection system and the optical member, the reference mark, as well as to illuminate the fixed mark, and, through the optical projection system and the optical member, the reference mark;

the third position detection system comprising a photoelectric detector, arranged to be used in conjunction with the second position detection system also;

the photoelectric detector being arranged to intercept light from an image of the reticle positioning mark formed on the reference mark by the optical projection system and the optical member when the second position detection system detects the relative position of the reference mark and the reticle; and the photoelectric detector being arranged to intercept light from an image of the fixed mark, formed on the reference mark by the optical projection system and the optical member, whenever the third position detection system detects the relative position of the reference mark and the fixed mark.

17. The apparatus of claim 11, wherein:

the exposure illumination system is arranged to illuminate the reticle positioning mark and, through the optical projection system and the optical member, the reference mark;

the third position detection system comprising a fixed mark illumination system that illuminates the fixed mark and, through the optical projection system and the optical member, the reference mark;

the third position detection system further comprising a photoelectric detector arranged to be used also in conjunction with said second position detection system;

the photoelectric detector being arranged to intercept light from an image of the reticle positioning mark formed on the reference mark, by the optical projection system and the optical member, when the second position detection system detects the relative position of the reference mark and the reticle; and the photoelectric detector being arranged to intercept light from an image of the fixed mark formed on the reference mark by the optical projection system and the optical member, whenever the third position detection system detects the relative position of the reference mark and the fixed mark.

18. The apparatus of claim 17, wherein the third position detection system comprises a light guide arranged to be used in conjunction with the second position detection system also, the light guide being positioned between the reference mark and the photoelectric detector.

19. The apparatus of claim 16, wherein the third position detection system comprises a light guide arranged to be used in conjunction with the second position detection system also, the light guide being positioned between the reference mark and the photoelectric detector.

20. The apparatus of claim 16, further comprising an optical magnification system that forms a magnified image of the images of the reference mark, and any image formed on the reference mark, on the light receiving surface of the photoelectric detector.

21. A method of exposing a pattern, defined on a reticle having a mark thereon, onto a photosensitive substrate, the method comprising:
   (a) providing an exposure apparatus having a fixed mark near the location at which the reticle will be supported for exposure, a stage, having a reference mark, for supporting the substrate, and a projection system for projecting an image of a pattern on the reticle onto the substrate;
   (b) measuring, through an optical path including the projection system, the relative position of the reference mark and the fixed mark; and
   (c) measuring, through an optical path including the projection system, the relative position of the mark on the reticle and the reference mark and correcting the result by an offset determined a least in part by the measurement of the relative position of the reference mark and the fixed mark.

* * * * *

UNITED STATES PATENT AND TRADEMARK OFFICE
CERTIFICATE OF CORRECTION

PATENT NO.   : 5,978,069
DATED        : November 2, 1999
INVENTOR(S)  : Masaki Kato It is certified that error appears in the above-identified patent and that said Letters Patent is hereby corrected as shown below:

Column 1,
Line 38, "U.S. Pat. No. 4,943,73" should be -- U.S. Pat. No. 4,943,733 --.
Line 58, "thereon)." should be -- thereon.) --.

Column 2,
Line 45, "due a" should be -- due to a --.

Column 7,
Line 11, "guides the a" should be -- guides a --.

Column 9,
Line 12, "FIG. 3(b)" should be -- FIG. 3(b). --.

Column 12,
Line 23, "using to the" should be -- using the --.

Column 14,
Line 11, "marks" should be -- mark --.

Column 15,
Line 7, "reflected a mirror" should be -- reflected by a mirror --.
Line 24, "on reticle the mark" should be -- on the reticle mark --.

Column 19,
Line 62, "ark" should be -- mark --.

Claim 1, column 23,
Line 1, the comma "," should be a semi-colon -- ; --.

UNITED STATES PATENT AND TRADEMARK OFFICE
CERTIFICATE OF CORRECTION

PATENT NO. : 5,978,069
DATED : November 2, 1999
INVENTOR(S) : Masaki Kato

It is certified that error appears in the above-identified patent and that said Letters Patent is hereby corrected as shown below:

Claim 11, column 24,
Line 41, "a an image" should be -- an image --.

Signed and Sealed this

Eighteenth Day of September, 2001

*Attest:*

NICHOLAS P. GODICI
*Attesting Officer*   *Acting Director of the United States Patent and Trademark Office*